(12) United States Patent
Jeon et al.

(10) Patent No.: US 12,743,182 B2
(45) Date of Patent: Sep. 22, 2026

(54) DISPLAY DEVICE AND ELECTRONIC DEVICE INCLUDING THE SAME

(71) Applicant: Samsung Display Co., Ltd., Yongin-si (KR)

(72) Inventors: Eunjeong Jeon, Yongin-si (KR); Eui Jeong Kang, Yongin-si (KR); Hyunseok Ko, Yongin-si (KR); Dong-Youb Lee, Yongin-si (KR); Jinuk Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/279,177

(22) Filed: Jul. 24, 2025

(65) Prior Publication Data

US 2026/0126882 A1 May 7, 2026

(30) Foreign Application Priority Data

Nov. 1, 2024 (KR) ........................ 10-2024-0153567

(51) Int. Cl.

| | |
|---|---|
| ***G06F 3/046*** | (2006.01) |
| ***H05K 1/02*** | (2006.01) |
| *B32B 15/04* | (2006.01) |
| *B32B 15/08* | (2006.01) |

(52) U.S. Cl.

CPC ........... *G06F 3/046* (2013.01); *H05K 1/0213* (2013.01); *B32B 15/046* (2013.01); *B32B 15/08* (2013.01); *B32B 2457/20* (2013.01); *G06F 2203/04102* (2013.01); *H05K 2201/10128* (2013.01)

(58) Field of Classification Search

None

See application file for complete search history.

(56) References Cited

U.S. PATENT DOCUMENTS

| | | | | |
|---|---|---|---|---|
| 2023/0096996 | A1* | 3/2023 | Kishimoto | H10K 59/131 345/174 |
| 2023/0113544 | A1* | 4/2023 | Ha | B32B 17/10 428/138 |
| 2023/0289021 | A1* | 9/2023 | Jeon | G06F 3/046 |

FOREIGN PATENT DOCUMENTS

| | | | |
|---|---|---|---|
| JP | 2007-035546 | A2 | 2/2007 |
| JP | 2014-192337 | A2 | 10/2014 |
| KR | 10-2022-0033560 | A | 3/2022 |

* cited by examiner

*Primary Examiner* — Nicholas J Lee

(74) *Attorney, Agent, or Firm* — F. CHAU & ASSOCIATES, LLC

(57) ABSTRACT

A display device includes a display panel having a first non-folding area, a second non-folding area, and a folding area between them. A digitizer is arranged under the display panel and overlaps the first and second non-folding areas, the digitizer including a loop coil. A metal layer is positioned under the digitizer, with a cushioning member arranged beneath the metal layer. A circuit board is located under the digitizer and is electrically connected to it. A circuit board lead is positioned on the circuit board, with a protection member arranged over the circuit board lead. The digitizer and circuit board are bonded by an anisotropic conductive film. The cushioning member includes a first cushioning layer with a first opening and a second cushioning layer beneath it, overlapping the first opening and having a second opening in an offset location.

20 Claims, 18 Drawing Sheets

FIG. 3B

AA'
DP-DA
DP-TA
PA
BT BLL
DP-TA
PX2-R
PX2-B PX2-G
PX2
LA
LA
PX1-B
PX1-R
PX1-G
PX1
NLA
DP-DA
DR1
DR2
DR3

DISPLAY DEVICE AND ELECTRONIC DEVICE INCLUDING THE SAME

CROSS-REFERENCE TO RELATED APPLICATION

This U.S. patent application claims priority under 35 U.S.C. § 119 to Korean Patent Application No. 10-2024-0153567, filed on Nov. 1, 2024, in the Korean Intellectual Property Office, the disclosure of which is incorporated by reference in its entirety herein.

1. TECHNICAL FIELD

The present disclosure is directed to a display device and an electronic device including the same, and more particularly, to a display device with enhanced surface quality and an electronic device including the display device.

2. DISCUSSION OF RELATED ART

A display device includes a display area that is activated by an electrical signal. The display device may detect an input applied from outside through the display area and at the same time, display various images to provide information to a user. The display device may be made foldable and retain its ability to detect the input if it is designed using flexible Organic Light Emitting Diode panels and combined with bendable touch sensor technology.

The display device may include a digitizer that detects and processes touch inputs. For example, the digitizer may convert touch gestures into electrical signals for allowing the display device to respond accordingly. A bonding process may be used to bond the digitizer to other components during manufacture of the display device. However, deformation or indentation of the digitizer may occur during this bonding process, which may cause touch sensitivity issues, visible screen defects and structural weaknesses.

SUMMARY

At least one embodiment of the present disclosure provides a display device having enhanced surface quality when a digitizer and a sensing circuit board are pressed, and an electronic device including the display device. However, the scope of the present disclosure is not limited thereto as additional features and enhancements may be provided by the embodiments.

According to an aspect of the present disclosure, a display device includes a display panel including a first non-folding area, a second non-folding area, and a folding area arranged between the first non-folding area and the second non-folding area, a lower member arranged under the display panel, a digitizer module arranged under the lower member, and a circuit board module arranged in a region under the digitizer module, in which the lower member includes a panel support that overlaps at least the first non-folding area and the second non-folding area, and the digitizer module includes a digitizer including a loop coil and overlapping the first non-folding area and the second non-folding area, a metal layer arranged under the digitizer, and a cushioning member arranged under the metal layer, and the circuit board module includes a circuit board electrically connected to the digitizer and arranged under the digitizer, a circuit board lead arranged on the circuit board, and a protection member arranged on the circuit board lead, and the digitizer module and the circuit board module are bonded by an anisotropic conductive film, and the cushioning member includes a first cushioning layer having a first opening, and a second cushioning layer arranged under the first cushioning layer and overlapping the first opening, the second cushioning layer having a second opening.

In an embodiment, the circuit board lead may extend beyond the protection member, and the circuit board may extend further outward from the circuit board lead.

In an embodiment, the protection member may at least partially overlap a region of the anisotropic conductive film.

In an embodiment, an outer end of the protection member may be located in the first opening.

In an embodiment, the anisotropic conductive film may be positioned in a region that overlaps at least the circuit board lead in the first opening.

In an embodiment, the second opening may include a first area that overlaps the protection member and a second area adjacent to the first area, and a width of the first area may be greater than a width of the second area.

In an embodiment, the anisotropic conductive film may cover at least a part of the second area.

In an embodiment, an outer end of the circuit board is located on the second area or the second cushioning layer.

In an embodiment, an outer end of the circuit board lead corresponds to an inner end of the second area.

According to another aspect of the present disclosure, an electronic device includes an input module, a memory storing at least one program, a processor configured to operate by executing the at least one program, a display device, and a power module configured to supply power to the display device, in which the processor is further configured to control the input module to obtain data and control the display device to visually display the data, and the display device includes a display module including a first non-folding area, a second non-folding area, and a folding area arranged between the first non-folding area and the second non-folding area, a lower member arranged under the display module, a digitizer module arranged under the lower member, and a circuit board module arranged in a region under the digitizer module, in which the lower member includes a panel support that overlaps at least the first non-folding area and the second non-folding area, and the digitizer module includes a digitizer including a loop coil and overlapping the first non-folding area and the second non-folding area, a metal layer arranged under the digitizer, and a cushioning member arranged under the metal layer, and the circuit board module includes a circuit board electrically connected to the digitizer and arranged under the digitizer, a circuit board lead arranged on the circuit board, a protection member arranged on the circuit board lead, and an anisotropic conductive film bonding the digitizer module and the circuit board module, in which the cushioning member includes a first cushioning layer having a first opening, and a second cushioning layer arranged under the first cushioning layer and overlapping the first opening, the second cushioning layer having a second opening.

In an embodiment, the electronic device may further include an embedded module, in which the embedded module includes a sensor module configured to detect an input and generate data corresponding to the input, an antenna module configured to exchange the data with an external electronic device, and an audio output module, in which the processor is further configured to control the audio output module to output the data audibly.

In an embodiment, the electronic device may further include an external module, in which the external module includes a camera module configured to capture an image, a light module configured to output light; and a communication module configured to exchange the data between the electronic device and the external electronic device.

In an embodiment, the circuit board lead may extend beyond the protection member, and the circuit board may extend further outward from the circuit board lead.

In an embodiment, the protection member may at least partially overlap a region of the anisotropic conductive film.

In an embodiment, an outer end of the protection member may be located in the first opening.

In an embodiment, the anisotropic conductive film may be positioned in a region that overlaps at least the circuit board lead in the first opening.

In an embodiment, the second opening includes a first area that overlaps the protection member and a second area adjacent to the first area, and a width of the first area may be greater than a width of the second area.

In an embodiment, the anisotropic conductive film may cover at least a part of the second area.

In an embodiment, the outer end of the circuit board is located on the second area or the second cushioning layer.

In an embodiment, the outer end of the circuit board lead corresponds to an inner end of the second area.

According to an aspect of the present disclosure, a display device includes a display panel, a digitizer, a circuit board, a metal layer, a protection member, an anisotropic conductive film and a cushioning member. The display panel includes a first non-folding area, a second non-folding area, and a folding area arranged between the first non-folding area and the second non-folding area. The digitizer is arranged under the display panel. The circuit board is electrically connected to the digitizer and arranged under the digitizer. The circuit board lead is arranged on the circuit board. The metal layer is arranged under the digitizer. The protection member is arranged on the circuit board lead. The anisotropic conductive film is for bonding the digitizer to the circuit board. The cushioning member is arranged under the metal layer. A first cushioning layer of the cushioning member has a first opening. A second cushioning layer of the cushioning member is arranged under the first cushioning layer, overlaps the first opening, and hag a second opening offset from the first opening.

BRIEF DESCRIPTION OF THE DRAWINGS

FIG. 3B is a plan view of a partial region of a display panel according to an embodiment of the present disclosure;

DETAILED DESCRIPTION

Figure 1A:
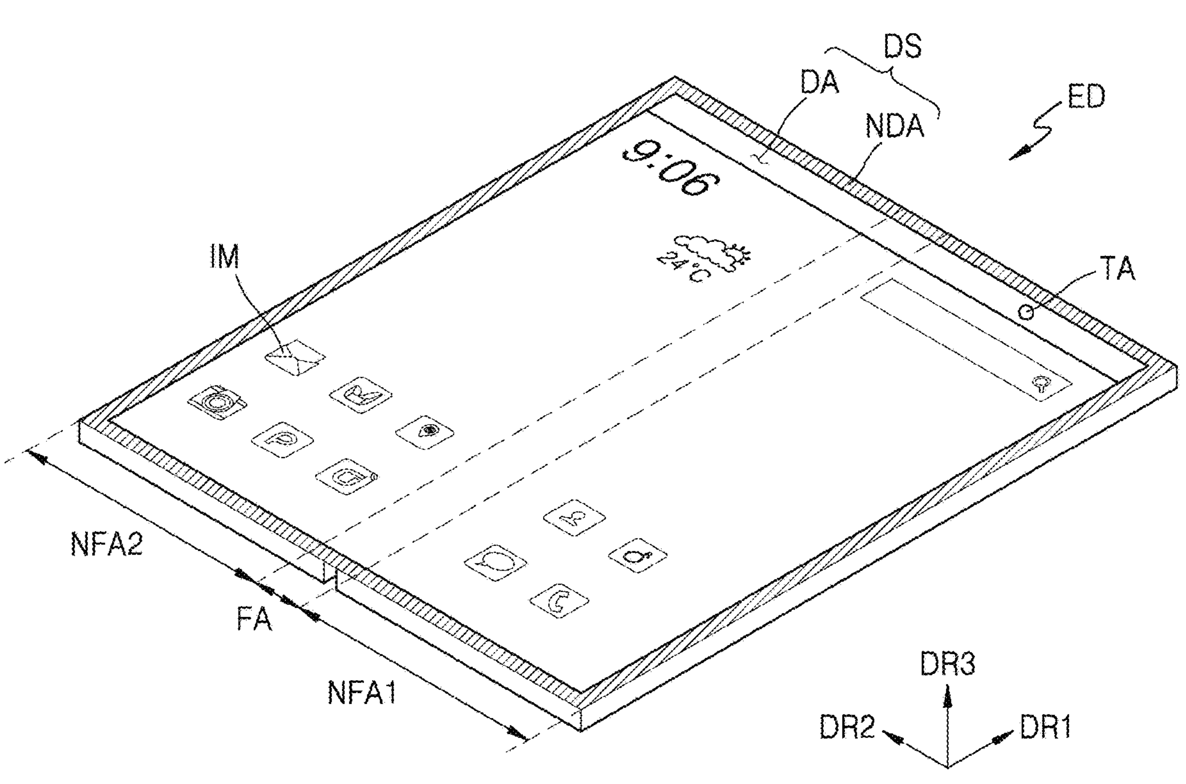
FIGS. 1A to 1C are perspective views of an electronic device according to an embodiment of the present disclosure.

The present disclosure may be modified in various ways and implemented in different embodiments. Accordingly, specific embodiments are illustrated in the drawings and described in the following detailed description. Effects and features of the present disclosure, and methods for achieving them will become clear with reference to the embodiments described later in detail together with the drawings. However, the present disclosure is not limited to the embodiments disclosed below and may be implemented in various forms.

In the following embodiments, terms such as first, second, etc., are used to distinguish one component from another rather than to impose any limitations.

In the following embodiments, singular forms include plural forms unless apparently indicated otherwise contextually.

In the following embodiments, the terms “include”, “have”, or the like, are intended to mean that there are features, or components, described herein, but do not preclude the possibility of adding one or more other features or components.

In the following embodiments, when a portion, such as a film, a region, a component, etc., is present on or above another portion, this case may include not only a case where it is directly on the other portion, but also a case where another film, region, component, etc., is arranged between the portion and the other portion.

In the examples below, terms such as connect or combine do not necessarily imply a direct and/or fixed connection or combination of two members, unless the context clearly indicates otherwise, and do not exclude the presence of another member between the two members.

At least one embodiment of the present disclosure is directed to a foldable display device with structural modifications designed to enhance surface evenness, mechanical reliability, and durability by addressing issues arising from Anisotropic Conductive Film (ACF) pressing. The embodiment introduces design optimization to a digitizer of a display device. To reduce surface deformation and stress concentration during a pressing process of bonding the digitizer and a circuit board using the ACF, the embodiment incorporates a multi-layer cushioning member into the digitizer that includes a first cushioning layer with a first opening and a second cushioning layer arranged under the first cushioning layer and overlapping the first opening but with a second opening in a different location. This staggered structure redistributes ACF pressing pressure, preventing localized indentations and ensuring more even force distribution. Additionally, a metal layer may be provided beneath the digitizer to provide further structural support. In another embodiment, the cushioning member is further refined to enhance surface evenness and mechanical stability. By expanding a first cushioning layer of the cushioning member while reducing a second cushioning layer of the cushioning member, the embodiment strategically relocates interference areas to prevent sagging and mitigate bending issues.

Hereinafter, embodiments of the present disclosure will be described in detail with reference to the attached drawings. When describing with reference to the drawings, identical or corresponding components are given the same drawing reference numerals and redundant descriptions thereof will be omitted.

Figure 1B:
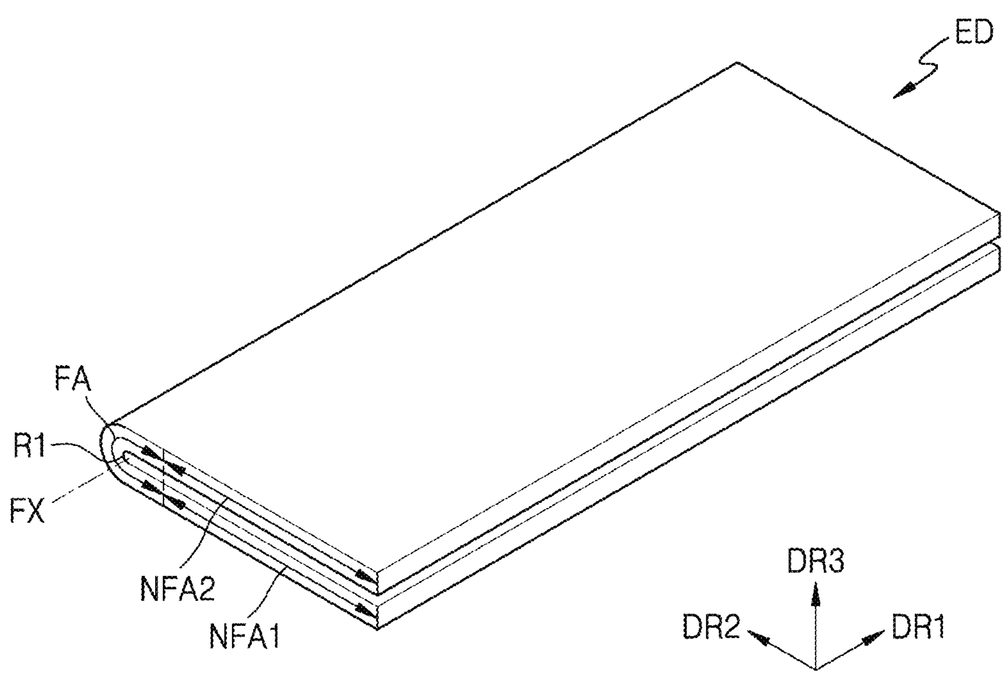
Figure 1C:
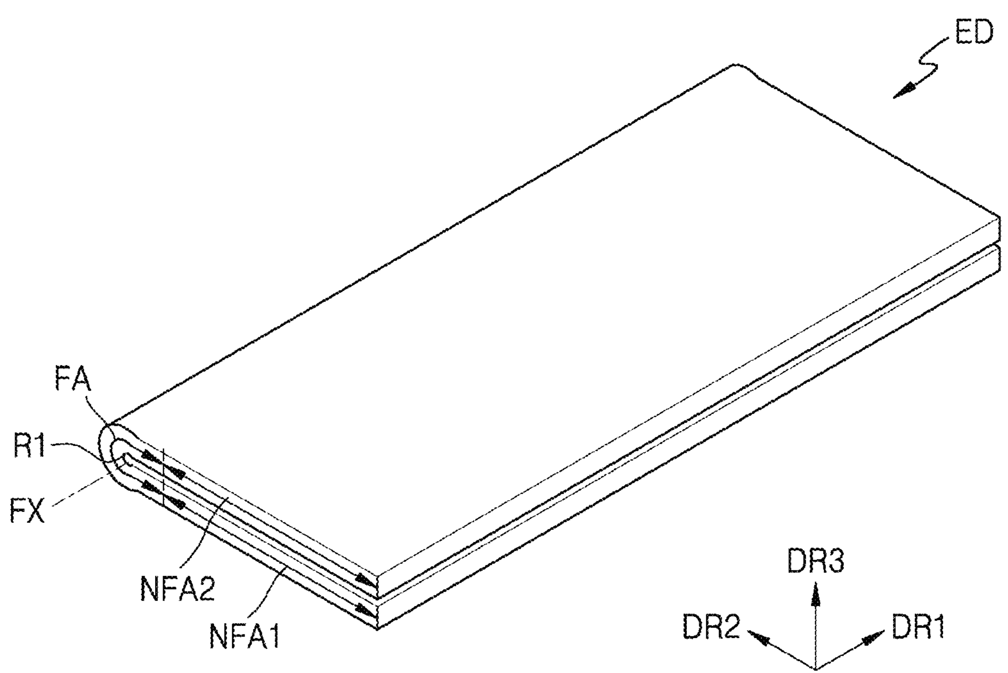

FIGS. 1A to 1C are perspective views of an electronic device according to an embodiment of the present disclosure. FIG. 1A shows an unfolded state, and FIGS. 1B and 1C show a folded state.

Referring to FIGS. 1A to 1C, an electronic device ED according to an embodiment of the present disclosure may include a display surface DS defined by a first direction DR1 and a second direction DR2 intersecting the first direction DR1. The electronic device ED may provide an image IM to a user through the display surface DS.

The display surface DS may include a display area DA and a non-display area NDA around the display area DA. The display area DA may display the image IM, and the non-display area NDA does not display the image IM. The non-displayable area NDA may surround the display area DA. However, the present disclosure is not limited thereto, and a shape of the display area DA and a shape of the non-display area NDA may be changed.

The display surface DS may include a sensing area TA. The sensing area TA may be a partial region of the display area DA. The sensing area TA may have a greater transmissivity than other regions of the display area DA. Hereinafter, the regions of the display area DA other than the sensing area TA may be defined as general display areas.

An optical signal such as visible light or infrared light, may travel to the sensing area TA. The electronic device ED may capture an external image via visible light passing through the sensing area TA, or determine the accessibility of an external object via infrared light. In FIG. 1A, one sensing area TA is illustrated as an example, but the present disclosure is not limited thereto since a plurality of sensing areas TA may be provided.

Hereinafter, a direction substantially perpendicularly intersecting a plane defined by the first direction DR1 and the second direction DR2 may be defined as a third direction DR3. The third direction DR3 may be a criterion for distinguishing a front surface and a back surface of each member. Herein, "on a plane" may be defined as a state viewed from the third direction DR3. Hereinafter, the first to third directions DR1, DR2, and DR3 refer to the same drawing symbols as directions indicated by first to third direction axes, respectively.

The electronic device ED may include a folding area FA and a plurality of non-folding areas NFA1 and NFA2. The non-folding areas NFA1 and NFA2 may include a first non-folding area NFA1 and a second non-folding area NFA2. In the second direction DR2, the folding area FA may be arranged between the first non-folding area NFA1 and the second non-folding area NFA2.

As shown in FIG. 1B, the folding area FA may be folded with respect to the folding axis FX parallel to the first direction DR1. The folding area FA may have a selected curvature and a selected radius of curvature R1. The first non-folding area NFA1 and the second non-folding area NFA2 may face each other, and the electronic device ED may be inner-folded such that the display surface DS is not exposed to the outside.

In an embodiment of the present disclosure, the electronic device ED may be outer-folded such that the display surface DS is exposed to the outside. In an embodiment of the present disclosure, the electronic device ED may be configured such that an in-folding or out-folding state is mutually repeated from an unfolding state, but the present disclosure is not limited thereto. In an embodiment of the present disclosure, the electronic device ED may be configured to select any one of the unfolding state, the in-folding state, and the out-folding state.

As shown in FIG. 1B, a distance between the first non-folding area NFA1 and the second non-folding area NFA2 may be substantially equal to the radius of curvature R1, but as shown in FIG. 1C, the distance between the first non-folding area NFA1 and the second non-folding area NFA2 may be less than the radius of curvature R1. FIGS. 1B and 1C are drawings shown based on the display surface DS, and a housing HM (see FIG. 2A) forming the exterior of the electronic device ED may be in contact in terminal regions of the first non-folding area NFA1 and the second non-folding area NFA2.

Figure 2A:
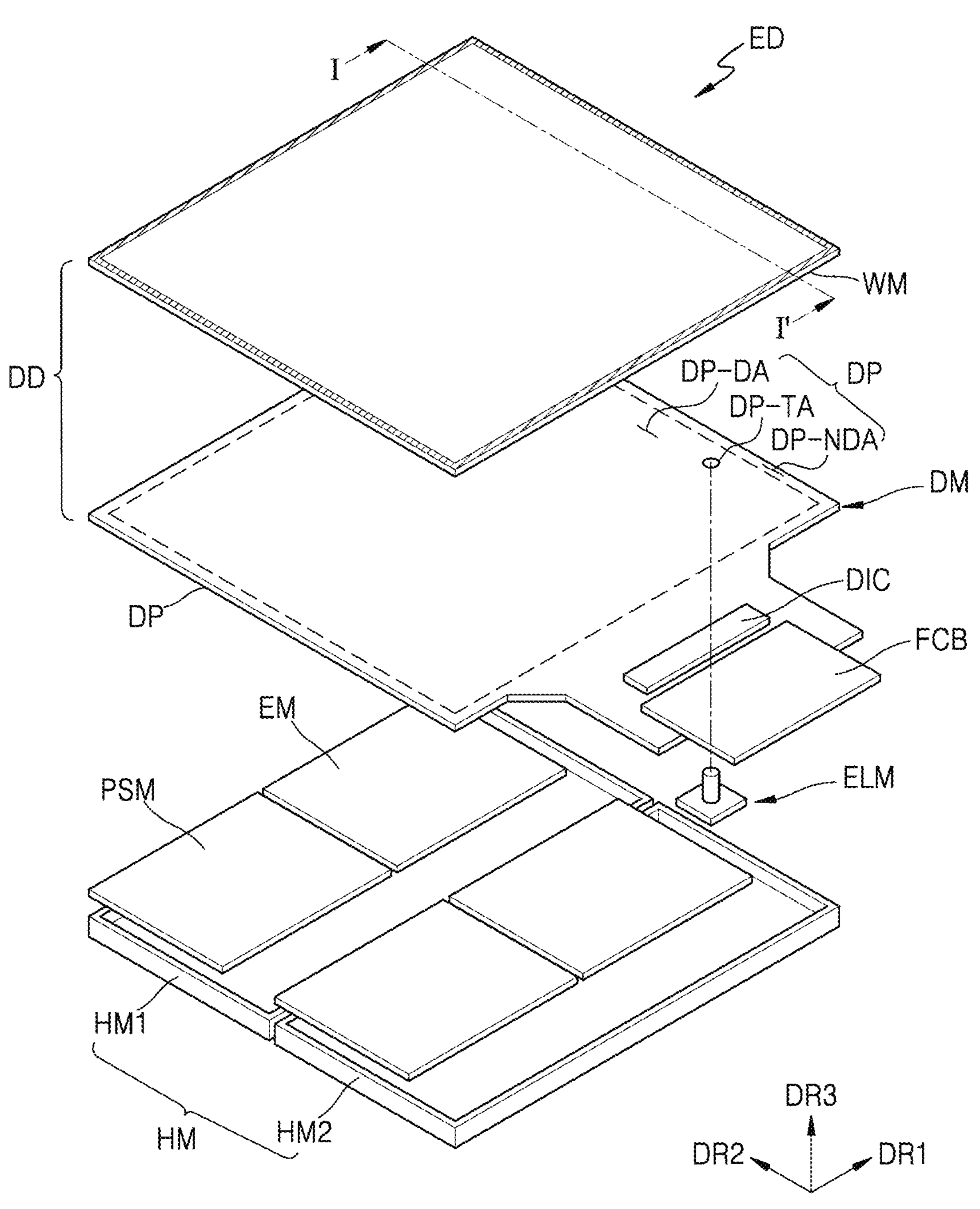
FIG. 2A is an exploded perspective view of an electronic device according to an embodiment of the present disclosure.
Figure 2B:
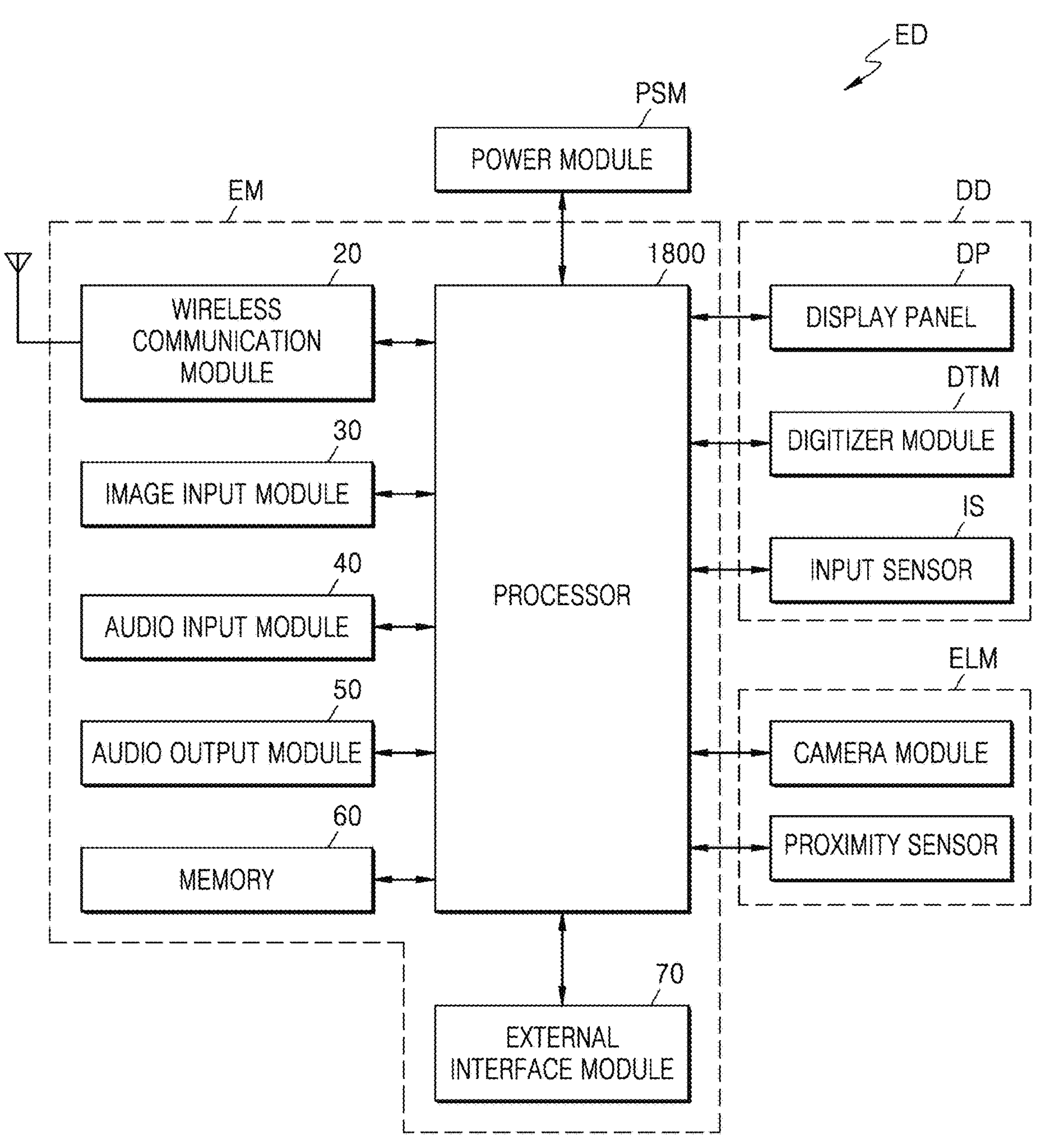
FIG. 2B is a block diagram of an electronic device according to an embodiment of the present disclosure.

FIG. 2A is an exploded perspective view of an electronic device according to an embodiment of the present disclosure, and FIG. 2B is a block diagram of an electronic device according to an embodiment of the present disclosure.

As shown in FIGS. 2A and 2B, the electronic device ED may include a display device DD, an electronic module EM, an electro-optical module ELM, a power module PSM, and the housing HM. Although not shown separately, the electronic device ED may further include a mechanical structure for controlling the folding states of the display device DD.

The display device DD may generate an image and detect an external input. The display device DD may include a window WM and a display module DM. The window WM may provide the front surface of the electronic device ED. A detailed description of the window WM will be provided later.

The display module DM may at least include a display panel DP. In FIG. 2A, only the display panel DP in a laminated structure of the display module DM is illustrated, but the display module DM may further include a plurality of configurations arranged on a top side of the display panel DP. A detailed description of the laminated structure of the display module DM will be provided below.

The display panel DP may be a light-emitting display panel but is not limited thereto. For example, they display panel DP may be an organic light-emitting display panel or a quantum dot light-emitting display panel. The display panel DP may be a display panel including an ultra-small light-emitting element such as a micro LED or a nano LED.

The display panel DP may include a display area DP-DA and a non-display area DP-NDA corresponding to the display area DA (see FIG. 1A) and the non-display area NDA (see FIG. 1A) of the electronic device ED. Herein, "regions (areas)/portions correspond to regions(areas)/portions" means overlapping and is not limited to the same area.

The display panel DP may include a sensing area DP-TA corresponding to the sensing area TA of FIG. 1A. The sensing area TA may be an area with a lower resolution than the display area DP-DA. A detailed description of the sensing area DP-TA will be given below.

As shown in FIG. 2A, a driving chip DIC may be arranged on the non-display area DP-NDA of the display panel DP. A flexible circuit board FCB may be bonded to the non-display area DP-NDA of the display panel DP. The flexible circuit board FCB may be connected to a main circuit board. The main circuit board may be a single electronic component constituting the electronic module EM.

The driving chip DIC may include driving elements for driving pixels of the display panel DP, such as a data driving circuit. While a structure in which the driving chip DIC is mounted on the display panel DP is illustrated in FIG. 2A, the present disclosure is not limited thereto. For example, the driving chip DIC may be mounted on the flexible circuit board FCB.

As shown in FIG. 2B, the display device DD may further include an input sensor IS and a digitizer module DTM (e.g., may include a digitizer). The input sensor IS may detect a user's input. The capacitive input sensor IS may be arranged on a top side of the display panel DP. The digitizer module DTM may detect an input from a stylus pen. An For example, the digitizer module DTM may include an electromagnetic-inductive digitizer arranged below the display panel DP.

The electronic module EM may include a processor 1800, a wireless communication module 20, an image input module 30, an audio input module 40, an audio output module 50, a memory 60, an external interface module 70. The electronic module EM may include a main circuit board, and the other modules may be mounted on the main circuit board or electrically connected to the main circuit board via a flexible circuit board. The electronic module EM may be electrically connected to the power module PSM.

Referring to FIG. 2A and FIG. 2B, the electronic module EM may be arranged in each of a first housing HM1 and a second housing HM2, and the power module PSM may be arranged in each of the first housing HM1 and the second housing HM2. The electronic module EM arranged in the first housing HM1 and the electronic module EM arranged in the second housing HM2 may be electrically connected via the flexible circuit board.

The processor 1800 may control overall operations of the electronic device ED. For example, the processor 1800 may activate or deactivate the display device DD according to a user's input. The processor 1800 may control the image input module 30, the audio input module 40 and the audio output module 50 according to the user's input. The processor 1800 may include at least one microprocessor.

The wireless communication module 20 may transmit/receive wireless signals with other terminals by using Bluetooth or Wi-Fi line. The wireless communication module 20 may transmit/receive voice signals using a general communication line. The wireless communication module 20 may include a plurality of antenna modules or antennas.

The image input module 30 may process an image signal and convert the same into image data displayable on the display device DD. The audio input module 40 may receive an external audio signal through a microphone in a recording mode or a voice recognition mode, and convert the same into electrical voice data. The audio output module 50 may convert audio data received from the wireless communication module 20 or audio data stored in the memory 60 and output the same to the outside.

The external interface module 70 may serve as an interface connected to an external charger, a wired/wireless data port, a card socket (e.g., a memory card, a SIM/UIM card), etc.

The power module PSM may supply power required for the overall operation of the electronic device ED. The power module PSM may include a battery device.

The electro-optical module ELM may be an electronic component that outputs or receives an optical signal. The electro-optical module ELM may include a camera module and/or a proximity sensor. The camera module may capture images of the outside through the sensing area DP-TA.

The housing HM shown in FIG. 2A may be coupled with the display device DD, particularly with the window WM, to accommodate the other modules. The housing HM is illustrated as including, but is not limited to, the first and second housings HM1 and HM2 that are separate from each other. The electronic device ED may further include a hinge structure for connecting the first housing HM1 to the second housing HM2.

Figure 3A:
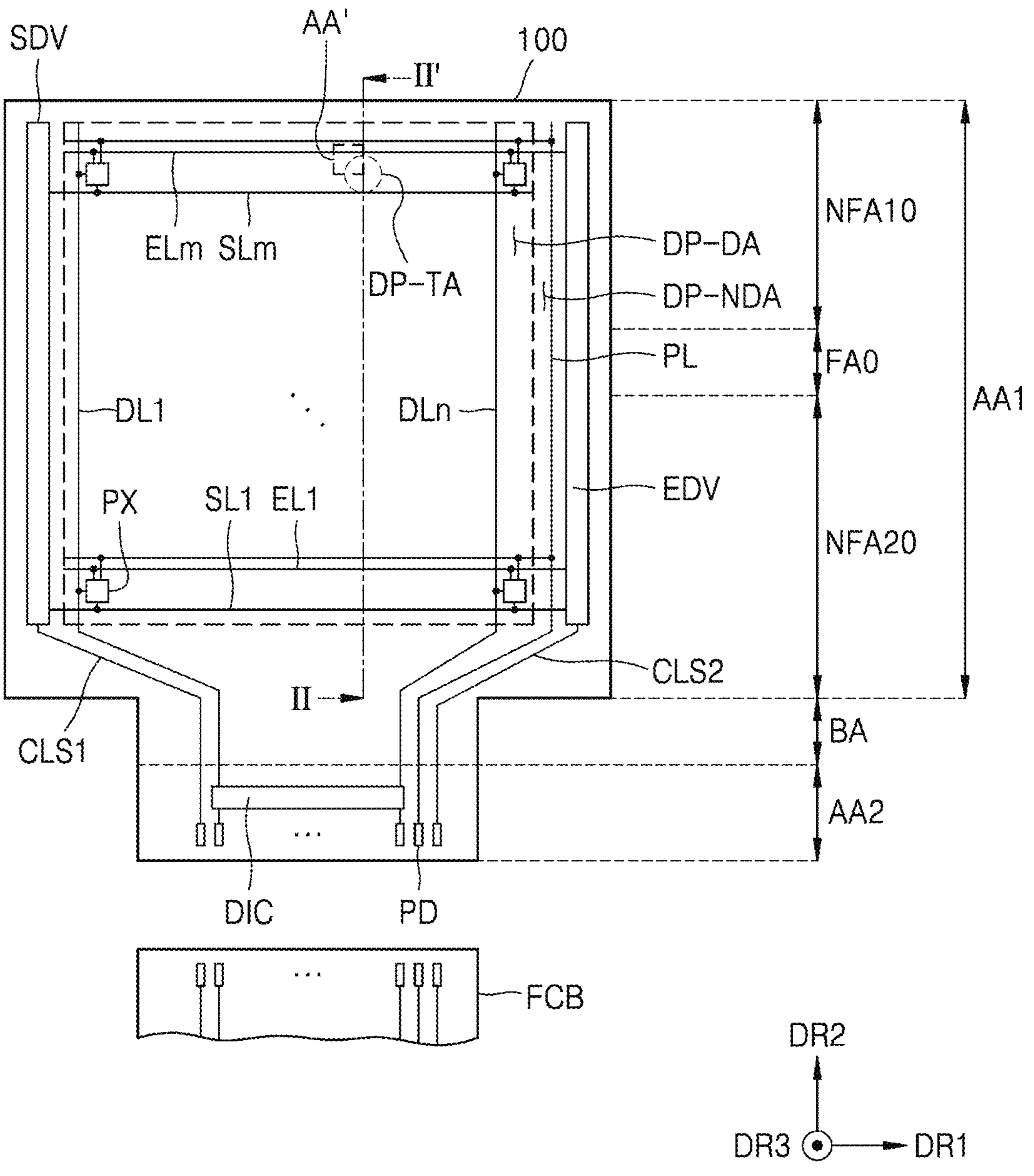
FIG. 3A is a plan view of a display panel according to an embodiment of the present disclosure.
Figure 3B:
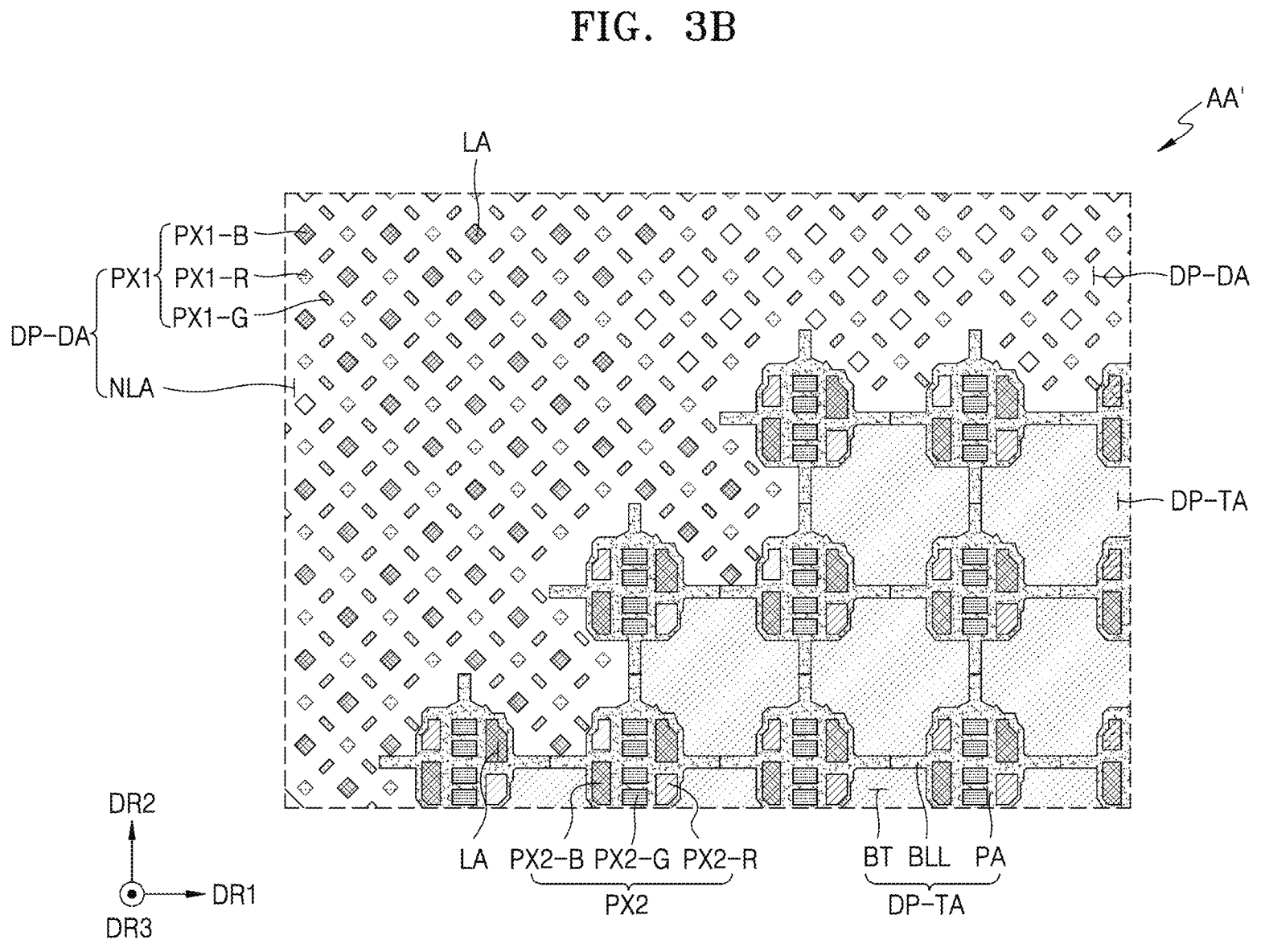

FIG. 3A is a plan view of a display panel according to an embodiment of the present disclosure, and FIG. 3B is a plan view of a partial region of the display panel according to an embodiment of the present disclosure. FIG. 3B is a plan view of an enlarged partial area AA' of FIG. 3A.

Referring to FIG. 3A, the display panel DP may include a display area DP-DA and a non-display area DP-NDA around the display area DP-DA. The display area DP-DA and the non-display area DP-NDA may be distinguished by the presence of pixels PX. The pixels PX may be arranged in the display area DP-DA. A scan driving unit SDV (e.g., a first driving circuit), a data driving unit (e.g., a second driving circuit), and a light-emitting driving unit EDV (e.g., a third driving circuit) may be arranged in the non-display area DP-NDA. The data driving unit may be some circuits within the driving chip DIC shown in FIG. 3A.

The display panel DP may include a first area AA1, a second area AA2, and a bending area BA distinguished in the second direction DR2. The second area AA2 and the bending area BA may be partial regions of the non-display area DP-NDA. The bending area BA may be arranged between the first area AA1 and the second area AA2.

The first area AA1 may be an area corresponding to the display surface DS of FIG. 1A. The first area AA1 may include a first non-folding area NFA10, a second non-folding area NFA20, and a folding area FAO. The first non-folding area NFA10, the second non-folding area NFA20, and the folding area FAO correspond to the first non-folding area NFA1, the second non-folding area NFA2, and the folding area FA of FIGS. 1A to 1C, respectively.

The lengths of the bending area BA and the second area AA2 in the first direction DR1 may be less than the length of the first area AA1. For example, an area with a shorter length along a bending axis may be bent more easily.

The display panel DP may include a plurality of pixels PX, a plurality of scan lines SL1 to SLm, a plurality of data lines DL1 to DLn, a plurality of light-emitting lines EL1 to ELm, first and second control lines CSL1 and CSL2, a power line PL, and a plurality of pads PD. Herein, m and n are natural numbers. The pixels PX may be connected to the scan lines SL1 to SLm, the data lines DL1 to DLn, and the light-emitting lines EL1 to ELm.

The scan lines SL1 to SLm may extend in the second direction DR2 and may be connected to the scan driving unit SDV. The data lines DL1 to DLn may extend in the second direction DR2 and may be connected to the driving chip DIC through the bending area BA. The light-emitting lines EL1 to ELm may extend in the first direction DR1 and may be connected to the light-emitting driving unit EDV.

The power line PL may include a portion extending in the second direction DR2 and a portion extending in the first direction DR1. The portion extending in the first direction DR1 and the portion extending in the second direction DR2 may be arranged in different layers. The portion of the power line PL extending in the second direction DR2 may extend to the second area AA2 via the bending area BA. The power line PL may provide a first voltage to the pixels PX.

A first control line CLS1 may be connected to the scan driving unit SDV and may extend toward the bottom of the second area AA2 via the bending area BA. A second control line CLS2 may be connected to the light-emitting driving unit EDV and may extend toward the bottom of the second area AA2 via the bending area BA.

On the plane, the pads PD may be arranged adjacent to the bottom of the second area AA2. The driving chip DIC, the power line PL, the first control line CLS1, and the second control line CLS2 may be connected to the pads PD. A flexible circuit board FCB may be electrically connected to the pads PD through an anisotropic conductive adhesive layer.

Referring to FIG. 3B, in an embodiment, the sensing area DP-TA is an area with higher light transmissivity and lower resolution than the display area DP-DA. The light transmissivity and the resolution may be measured within a reference area. The sensing area DP-TA may have a less occupancy ratio of a light-shielding structure within the reference area than the display area DP-DA. For example, the sensing area DP-TA may have fewer light-blocking components compared to the display area DP-DA when measured within a common reference area. The light-shielding structure may include at least one of a conductive pattern of a circuit layer, an electrode of a light-emitting element and a light-shielding pattern, as described below.

The sensing area DP-TA may have a less resolution within the reference area than the display area DP-DA. The sensing area DP-TA may have a lessor number of pixels arranged within the reference area (or the same area) than the display area DP-DA.

As shown in FIG. 3B, a first pixel PX1 may be arranged in the display area DP-DA, and a second pixel PX2 may be arranged in the sensing area DP-TA. The first pixel PX1 and the second pixel PX2 may have different light-emitting areas when comparing pixels of the same color. The first pixel PX1 and the second pixel PX2 may have different arrangements.

In FIG. 3B, light-emitting areas LA of the first pixel PX1 and the second pixel PX2 are shown as representing the first pixel PX1 and the second pixel PX2. Each of the light-emitting areas LA may be defined as an area where an anode of the light-emitting element is exposed through a pixel-defining film. A non-emitting area NLA may be arranged between the light-emitting areas LA in the display area DP-DA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. Each of the first pixel PX1 and the second pixel PX2 may include a red pixel, a green pixel, and a blue pixel.

The sensing area DP-TA may include a pixel area PA, a wiring area BLL, and a transmission area BT. The second pixel PX2 may be arranged in the pixel area PA. Although it is shown that two first color pixels PX2-R, four second color pixels PX2-G, and two third color pixels PX2-B are arranged within one pixel area PA, the present disclosure is not limited thereto.

A conductive pattern, a signal line, or a light-shielding pattern related to the second pixel PX2 may be arranged in the pixel area PA and the wiring area BLL. The light-shielding pattern may be a metal pattern and may substantially overlap the pixel area PA and the wiring area BLL. The pixel area PA and the wiring area BLL may be non-transmission areas.

The transmission area BT may be an area through which an optical signal actually passes. In the transmission area BT, as the second pixel PX2 is not arranged, the conductive pattern, the signal line, or the light-shielding pattern may be arranged. Thus, the transmission area BT may increase a light transmissivity of the sensing area DP-TA.

Figure 4:
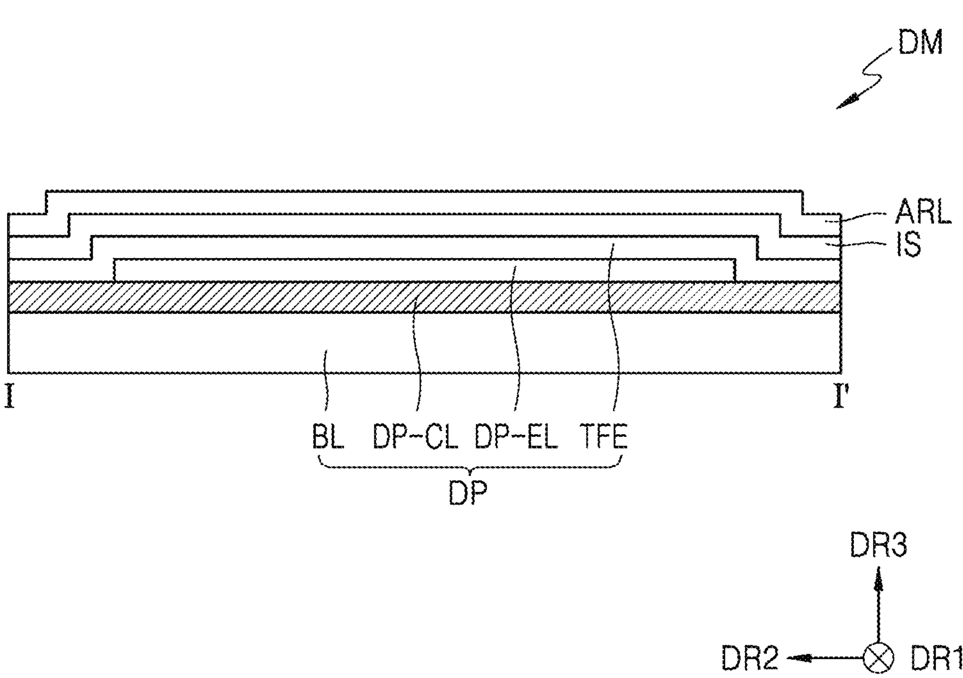
FIG. 4 is a cross-sectional view of a display module taken along line I-I' of FIG. 2A.

FIG. 4 is a cross-sectional view of a display module according to an embodiment of the present disclosure, that is, an example of a display module taken along line I-I' of FIG. 2A.

Referring to FIG. 4, the display module DM may include the display panel DP, the input sensor IS, and an anti-reflection layer ARL. The display panel DP may include a base layer BL, a circuit layer DP-CL, a light-emitting element layer DP-EL, and an encapsulation layer TFE.

The base layer BL may provide a base surface on which the circuit layer DP-CL is arranged. The base layer BL may be a flexible substrate capable of being bended, folded, or rolled. The base layer BL may be a glass substrate, a metal substrate or a polymer substrate. However, embodiment of the present disclosure are not limited thereto. For example, the base layer BL may be an inorganic layer, an organic layer, or a composite material layer.

The base layer BL may have a multi-layer structure. For example, the base layer BL may include a first synthetic resin layer, a multi-layer or single-layer inorganic layer, and a second synthetic resin layer arranged on the multi-layer or single-layer inorganic layer. Each of the first and second synthetic resin layers may include a polyimide-based resin but is not limited thereto.

The circuit layer DP-CL may be arranged in the base layer BL. The circuit layer DP-CL may include at least one of an insulating layer, a semiconductor pattern, a conductive pattern and a signal line.

The light-emitting element layer DP-EL may be arranged in the circuit layer DP-CL. The light-emitting element layer DP-EL may include a light-emitting element. For example, the light-emitting element may include an organic light-emitting material, an inorganic light-emitting material, an organic-inorganic light-emitting material, a quantum dot, a quantum rod, a micro LED, or a nano LED.

The encapsulation layer TFE may be arranged over the light-emitting element layer DP-EL. The encapsulation layer TFE may protect the light-emitting element layer DP-EL from foreign substances such as moisture, oxygen, and dust particles. The encapsulation layer TFE may include at least one inorganic layer. The encapsulation layer TFE may include a laminated structure of inorganic layer/organic layer/inorganic layer.

The input sensor IS may be arranged directly on the display panel DP. The display panel DP and input sensor IS may be formed through consecutive processes. Herein, "arranged directly" may mean that no third component is arranged between the input sensor IS and the display panel DP. That is, a separate adhesive layer may not be arranged between the input sensor IS and the display panel DP.

The anti-reflection layer ARL may be arranged directly on the input sensor IS. The anti-reflection layer ARL may reduce a reflectance of external light incident from the outside of the display device DD. The anti-reflection layer ARL may include color filters. The color filters may have a selected arrangement. For example, the color filters may be arranged in consideration of the light-emitting colors of the pixels included in the display panel DP. Furthermore, the anti-reflection layer ARL may further include a black matrix adjacent to the color filters.

In an embodiment of the present disclosure, the positions of the input sensor IS and the anti-reflection layer ARL may be exchanged. In an embodiment of the present disclosure, the anti-reflection layer ARL may be rearranged with a polarizing film. The polarizing film may be bonded to the input sensor IS via an adhesive layer.

Figure 5:
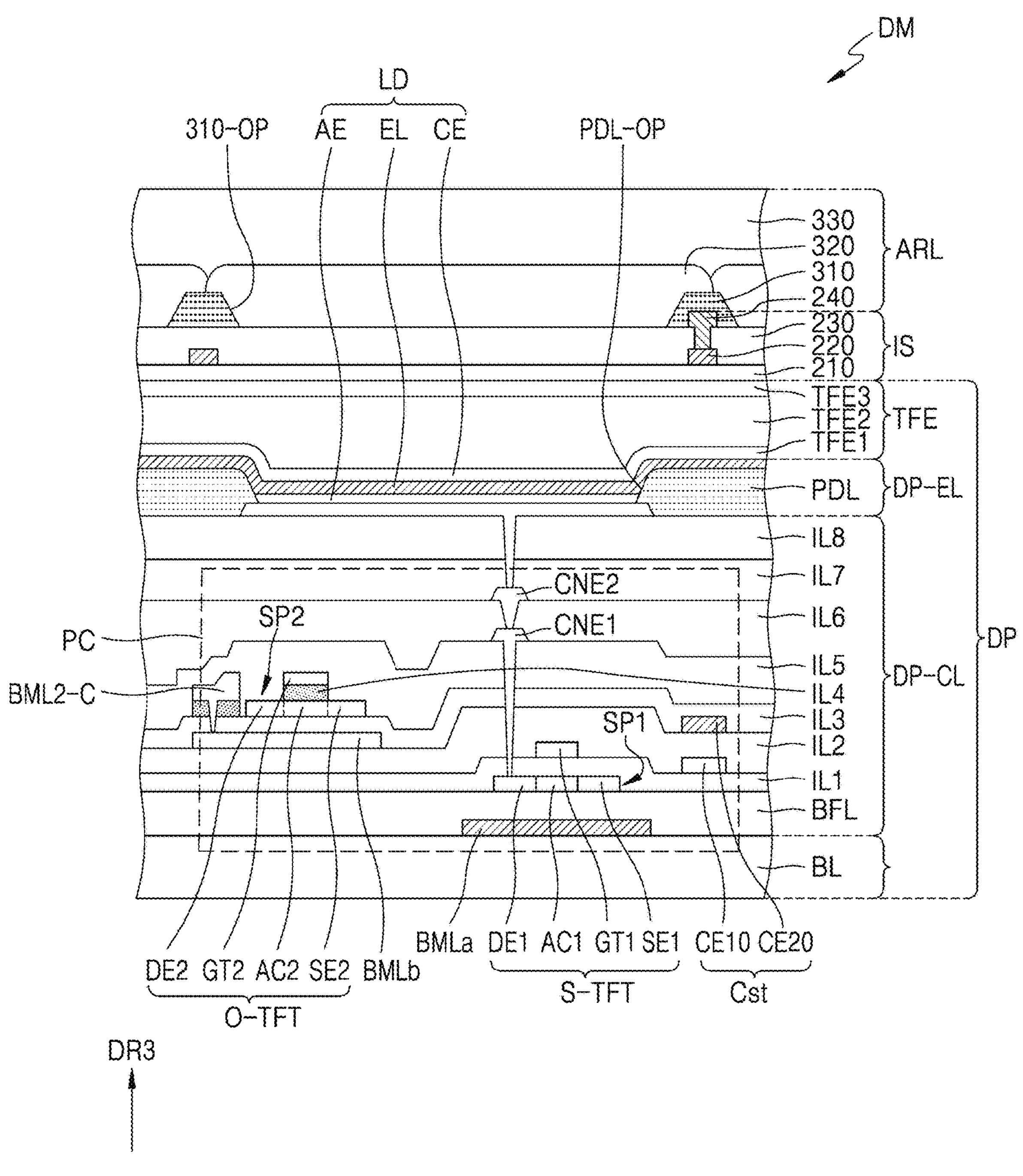
FIG. 5 is a cross-sectional view of a part of a display module according to an embodiment of the present disclosure.

FIG. 5 is a cross-sectional view of a part of a display module according to an embodiment of the present disclosure. In FIG. 5, a part of the display module DM according to an embodiment shown in FIG. 4 is illustrated in more detail. Specifically, FIG. 5 shows in more detail components corresponding to one pixel of the display modules DM according to an embodiment.

In FIG. 5, a silicon transistor S-TFT and an oxide transistor O-TFT of one light-emitting element LD and a pixel circuit PC are shown. At least one of a plurality of transistors included in the pixel circuit PC may be an oxide transistor O-TFT, and the other transistors may be silicon transistors S-TFT.

A cushioning layer BFL may be arranged in the base layer BL. The cushioning layer BFL may prevent metal atoms or impurities from spreading from the base layer BL to a first semiconductor pattern SP1 on an upper side with respect to the base layer BL. The first semiconductor pattern SP1 may include an active area AC1 of a silicon transistor S-TFT. The cushioning layer BFL may control a rate at which heat is provided during a crystallization process for forming the first semiconductor pattern SP1, thereby enabling the first semiconductor pattern SP1 to be formed uniformly.

A first back metal layer BMLa may be arranged under the silicon transistor S-TFT, and a second back metal layer BMLb may be arranged under an oxide transistor O-TFT. The first and second back metal layers BMLa and BMLb may be arranged to overlap the pixel circuit PC. The first and second back metal layers BMLa and BMLb may block external light from reaching the pixel circuit PC.

The first back metal layer BMLa may be arranged to correspond to at least a partial region of the pixel circuit PC. The first back metal layer BMLa may be arranged to overlap a driving transistor implemented with the silicon transistor S-TFT.

The first back metal layer BMLa may be arranged between the base layer BL and the cushioning layer BFL. In an embodiment of the present disclosure, an inorganic barrier layer may be further arranged between the first back metal layer BMLa and the cushioning layer BFL. The first back metal layer BMLa may be connected to an electrode or a line and may receive a constant voltage or a signal from the electrode or the line. According to an embodiment of the present disclosure, the first back metal layer BMLa may be a floating electrode that is isolated from other electrodes or lines.

The second back metal layer BMLb may be arranged corresponding to the bottom of the oxide transistor O-TFT. The second back metal layer BMLb may be arranged between a second insulating layer IL2 and a third insulating layer IL3. The second back metal layer BMLb may be arranged in a same layer as a second electrode CE20 of a storage capacitor Cst. The second back metal layer BMLb may be connected to a contact electrode BML2-C and may receive a constant voltage or a signal. The contact electrode BML2-C may be arranged in a same layer as a gate GT2 of the oxide transistor O-TFT.

Each of the first back metal layer BMLa and the second back metal layer BMLb may include a reflective metal. For example, each of the first back metal layer BMLa and the second back metal layer BMLb may include silver (Ag), an alloy containing silver (Ag), molybdenum (Mo), an alloy containing molybdenum, aluminum (Al), an alloy containing aluminum, an aluminum nitride (AlN), tungsten (W), a tungsten nitride (WN), copper (Cu), p+ doped amorphous silicon, etc. The first back metal layer BMLa and the second back metal layer BMLb may include the same material or different materials.

According to an embodiment of the present disclosure, the second back metal layer BMLb may be omitted. The first back metal layer BMLa may extend to the bottom of the oxide transistor O-TFT such that the first back metal layer BMLa may block light incident to the bottom of the oxide transistor O-TFT.

The first semiconductor pattern SP1 may be arranged on the cushioning layer BFL. The first semiconductor pattern SP1 may include a silicon semiconductor. For example, the silicon semiconductor may include amorphous silicon, polycrystalline silicon, etc. For example, the first semiconductor pattern SP1 may include low-temperature polysilicon.

While a part of the first semiconductor pattern SP1 arranged on the cushioning layer BFL is shown in FIG. 5, the first semiconductor pattern SP1 may be further arranged in other areas. The first semiconductor pattern SP1 may be arranged in a specific pattern across the pixels. The first semiconductor pattern SP1 may have different electrical properties depending on whether it is doped. The first semiconductor pattern SP1 may include a first area having a high conductivity and a second area having a low conductivity. The first area may be doped with an N-type dopant or a P-type dopant. A P-type transistor may include a doped area that is doped with a P-type dopant, and an N-type transistor may include a doped area that is doped with an N-type dopant. The second area may be an undoped region or an area that is doped at a lower concentration than the first area.

The conductivity of the first area may be greater than that of the second area, and the first area may substantially serve as an electrode or a signal line. The second area may substantially correspond to the active region (or channel) of the transistor. In other words, a part of the first semiconductor pattern SP1 may be an active region of the transistor, another part may be a source or drain of the transistor, and another part may be a connection electrode or a connection signal line.

A source region SE1 (or a source), an active area AC1 (or a channel), and a drain area DE1 (or a drain) of the silicon transistor S-TFT may be formed from the first semiconductor pattern SP1. A source region SE1 and a drain area DE1 may extend in opposite directions from the active area AC1 in a cross-section.

A first insulating layer IL1 may be arranged on the cushioning layer BFL. The first insulating layer IL1 may commonly overlap a plurality of pixels to cover the first semiconductor pattern SP1. The first insulating layer IL1 may be an inorganic layer and/or an organic layer, and may have a single-layer or multi-layer structure. The first insulating layer IL1 may include at least one of an aluminum oxide, a titanium oxide, a silicon oxide, a silicon nitride, a silicon oxynitride, a zirconium oxide, and a hafnium oxide. In an embodiment, the first insulating layer IL1 may be a single-layer silicon oxide layer. An insulating layer of the circuit layer DP-CL described later as well as the first insulating layer IL1 may be an inorganic layer and/or an organic layer, and may have a single-layer or multi-layer structure. The inorganic layer may include at least one of the materials described above but is not limited thereto.

A gate GT1 of the silicon transistor S-TFT may be arranged on the first insulating layer IL1. The gate GT1 may be part of a metal pattern. The gate GT1 may overlap the active area AC1. In a process of doping the first semiconductor pattern SP1, the gate GT1 may function as a mask. The gate GT1 may include titanium (Ti), silver (Ag), an alloy containing silver, molybdenum (Mo), an alloy containing molybdenum, aluminum (Al), an alloy containing aluminum, an aluminum nitride (AlN), tungsten (W), a tungsten nitride (WN), copper (Cu), an indium tin oxide (ITO) or an indium zinc oxide (IZO), but is not limited thereto.

The second insulating layer IL2 may be arranged on the first insulating layer IL1 to cover the gate GT1. The third insulating layer IL3 may be arranged on the second insulating layer IL2. The second electrode CE20 of the storage capacitor Cst may be arranged between the second insulating layer IL2 and the third insulating layer IL3. Additionally, a first electrode CE10 of the storage capacitor Cst may be arranged between the first insulating layer IL1 and the second insulating layer IL2.

A second semiconductor pattern SP2 may be arranged on the third insulating layer IL3. The second semiconductor pattern SP2 may include an active area AC2 of the oxide transistor O-TFT described later. The second semiconductor pattern SP2 may include an oxide semiconductor. The second semiconductor pattern SP2 may include a transparent conductive oxide (TCO) such as an indium tin oxide (ITO), an indium zinc oxide (IZO), an indium gallium zinc oxide (IGZO), a zinc oxide (ZnO) or an indium oxide ($In_2O_3$).

An oxide semiconductor may include a plurality of regions that are distinguished according to whether the transparent conductive oxide has been reduced. A region where the transparent conductive oxide is reduced (hereinafter, referred to as a reduced region) has a greater conductivity than a region where the transparent conductive oxide is not reduced (hereinafter, referred to as a non-reduced region). The reduced region may substantially act as a source/drain or a signal line of the transistor. The non-reduced region may substantially correspond to a semiconductor region (or an active region or a channel) of the transistor. In other words, a partial region of the second semiconductor pattern SP2 may be a semiconductor region of the transistor, other regions may be a source region/drain region of the transistor, and still other regions may be a signal transmission region.

A source region SE2 (or a source), an active area AC2 (or a channel), and a drain area DE2 (or a drain) of the oxide transistor O-TFT may be formed from the second semiconductor pattern SP2. The source region SE2 and the drain area DE2 may extend in opposite directions from the active area AC2 in a cross-section.

A fourth insulating layer IL4 may be arranged on the third insulating layer IL3. As shown in FIG. 5, the fourth insulating layer IL4 may be an insulating pattern that overlaps the gate GT2 of the oxide transistor O-TFT and is exposed by the source region SE2 and drain area DE2 of the oxide transistor O-TFT. As shown in FIG. 5, the fourth insulating layer IL4 may cover the second semiconductor pattern SP2.

As shown in FIG. 5, the gate GT2 of the oxide transistor O-TFT may be arranged on the fourth insulating layer IL4. The gate GT2 of the oxide transistor O-TFT may be a part of a metal pattern. The gate GT2 of the oxide transistor O-TFT may overlap the active area AC2.

A fifth insulating layer IL5 may be arranged on the fourth insulating layer IL4 and cover the gate GT2. A first connection electrode CNE1 may be arranged on and in a fifth insulating layer IL5. The first connection electrode CNE1 may be connected to the drain area DE1 of the silicon transistor S-TFT through a contact hole penetrating the first to fifth insulating layers IL1, IL2, IL3, IL4, and IL5.

A sixth insulating layer IL6 may be arranged on the fifth insulating layer IL5. The second connection electrode CNE2 may be arranged on and in the sixth insulating layer IL6. The second connection electrode CNE2 may be connected to the first connection electrode CNE1 through a contact hole penetrating the sixth insulating layer IL6. A seventh insulating layer IL7 may be arranged on the sixth insulating layer IL6 and may cover the second connection electrode CNE2. An eighth insulating layer IL8 may be arranged on the seventh insulating layer IL7.

Each of the sixth insulating layer IL6, the seventh insulating layer IL7, and the eighth insulating layer IL8 may be an organic layer. For example, each of the sixth insulating layer IL6, the seventh insulating layer IL7, and the eighth insulating layer IL8 may include a general-purpose polymer such as benzocyclobutene (BCB), polyimide, hexamethyldisiloxane (HMDSO), polymethylmethacrylate (PMMA), polystyrene PS, a polymer derivative having a phenol-based group, an acrylic polymer, an imide polymer, an aryl ether polymer, an amide polymer, a fluorinated polymer, a p-xylene polymer, a vinyl alcohol polymer or blends thereof.

A light-emitting element LD may include a first electrode AE, a light-emitting layer EL, and a second electrode CE. The second electrode CE may be provided in common in a plurality of light-emitting elements.

The first electrode AE of the light-emitting element LD may be arranged on the eighth insulating layer IL8. The first electrode AE of the light-emitting element LD may be a semi-transparent electrode or a reflective electrode. According to an embodiment of the present disclosure, each first electrode AE of the light-emitting element LD may include a reflective layer including Ag, Mg, Al, Pt, Pd, Au, Ni, Nd, Ir, Cr or a compound thereof, and a transparent or semi-transparent electrode layer formed in the reflective layer. The transparent or semi-transparent electrode layer may include at least one of indium tin oxide (ITO), indium zinc oxide (IZO), indium gallium zinc oxide (IGZO), zinc oxide (ZnO) or indium oxide (In2O3), and an aluminum-doped zinc oxide (AZO). For example, the first electrode AE of the light-emitting element LD may include a laminated structure of ITO/Ag/ITO.

A pixel-defining layer PDL may be arranged on the eighth insulating layer IL8. The pixel-defining layer PDL may have light-absorbing properties, for example, the pixel-defining layer PDL may have a black color. The pixel-defining layer PDL may include a black coloring agent. The black coloring agent may include a black dye or a black pigment. The black coloring agent may include carbon black, a metal such as chromium, or an oxide thereof. The pixel-defining layer PDL may correspond to a light-shielding pattern having light-shielding properties.

The pixel-defining layer PDL may cover a part of the first electrode AE of the light-emitting element LD. For example, an opening PDL-OP that exposes a part of the first electrode AE of the light-emitting element LD may be defined in the pixel-defining layer PDL. The pixel-defining layer PDL may increase the separation between the edge of the first electrode AE and the second electrode CE of the light-emitting element LD. Therefore, arcs, may be prevented from occurring at the edge of the first electrode AE by the pixel-defining layer PDL.

A hole control layer may be arranged between the first electrode AE and the light-emitting layer EL. The hole control layer may include a hole transport layer and may further include a hole injection layer. An electronic control layer may be arranged between the light-emitting layer EL and the second electrode CE. The electron control layer may include an electron transport layer and may further include an electron injection layer. The hole control layer and the electron control layer may be formed commonly for the plurality of pixels PX (see FIG. 3A) using an open mask.

The encapsulation layer TFE may be arranged on the light-emitting element layer DP-EL. The encapsulation layer TFE may include an inorganic layer TFE1, an organic layer TFE2, and an inorganic layer TFE3 that are sequentially laminated, but layers constituting the encapsulation layer TFE are not limited thereto.

The inorganic layers TFE1 and TFE3 may protect the light-emitting element layer DP-EL from moisture and oxygen, and the organic layer TFE2 may protect the light-emitting element layer DP-EL from foreign substances such as dust particles. The inorganic layers TFE1 and TFE3 may include a silicon nitride layer, a silicon oxynitride layer, a silicon oxide layer, a titanium oxide layer or an aluminum oxide layer. The organic layer TFE2 may include an acrylic-based organic layer but is not limited thereto.

The input sensor IS may be arranged on the display panel DP. The input sensor IS may be referred to as a sensor, an input sensing layer, or an input sensing panel. The input sensor IS may include a sensor base layer 210, a first conductive layer 220, a detecting insulation layer 230, and a second conductive layer 240.

The sensor base layer 210 may be arranged directly on the display panel DP. The sensor base layer 210 may be an inorganic layer including at least one of a silicon nitride, a silicon oxynitride, and a silicon oxide. Alternatively, the sensor base layer 210 may be an organic layer including an epoxy resin, an acrylic resin, or an imide-based resin. The sensor base layer 210 may have a single-layer structure or a multi-layer structure laminated in the third direction DR3.

Each of the first conductive layer 220 and the second conductive layer 240 may have a single-layer structure or a multi-layer structure laminated in the third direction DR3. The first conductive layer 220 and the second conductive layer 240 may include conductive lines defining mesh-shape detection electrodes. In an embodiment, the conductive lines do not overlap an opening PDL-OP but may overlap the pixel-defining layer PDL.

The conductive layer of the single-layer structure may include a metal layer or a transparent conductive layer. The metal layer may include molybdenum, silver, titanium, copper, aluminum, or alloys thereof. The transparent conductive layer may include a transparent conductive oxide, such as an indium tin oxide (ITO), an indium zinc oxide (IZO), a zinc oxide (ZnO) or an indium zinc tin oxide (IZTO). The transparent conductive layer may also include a conductive polymer such as PEDOT, a metal nanowire or graphene.

The conductive layer of the multi-layer structure may include sequentially laminated metal layers. The metal layers may have, for example, a three-layer structure of titanium/aluminum/titanium. The conductive layer of the multi-layer structure may include at least one metal layer and at least one transparent conductive layer.

The detecting insulation layer 230 may be arranged between the first conductive layer 220 and the second conductive layer 240. The detecting insulation layer 230 may include an inorganic film. The inorganic film may include at least one of an aluminum oxide, a titanium oxide, a silicon oxide, a silicon nitride, a silicon oxynitride, a zirconium oxide, and a hafnium oxide.

Alternatively, the detecting insulation layer 230 may include an organic film. The organic film may include at least one of an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The anti-reflection layer ARL may be arranged on the input sensor IS. The anti-reflection layer ARL may include a division layer 310, a plurality of color filters 320, and a planarization layer 330.

The division layer 310 is not limited to any particular material so as long as the material absorbs light. For example, the division layer 310 may be a layer having a black color that includes a black coloring agent in an embodiment. The black coloring agent may include a black dye or a black pigment. The black coloring agent may include carbon black, a metal such as chromium, or an oxide thereof.

The division layer 310 may cover the second conductive layer 240 of the input sensor IS. The division layer 310 may prevent external light from being reflected by the second conductive layer 240. In a partial region of the display module DM, the division layer 310 may be omitted. The transmissivity of a region where the division layer 310 is not arranged due to omission of the division layer 310 may be greater than those of other regions.

An opening 310-OP may be defined in the division layer 310. In an embodiment, the opening 310-OP overlaps the first electrode AE of the light-emitting element LD. Any one of the plurality of color filters 320 may overlap the first electrode AE of the light-emitting element LD. Any one of the plurality of color filters 320 may cover the opening 310-OP. Each of the plurality of color filters 320 may be in contact with the division layer 310.

The planarization layer 330 may cover the division layer 310 and the plurality of color filters 320. The planarization layer 330 may include an organic material and may provide a flat surface on a top surface of the planarization layer 330. In an embodiment of the present disclosure, the planarization layer 330 may be omitted.

Figure 6:
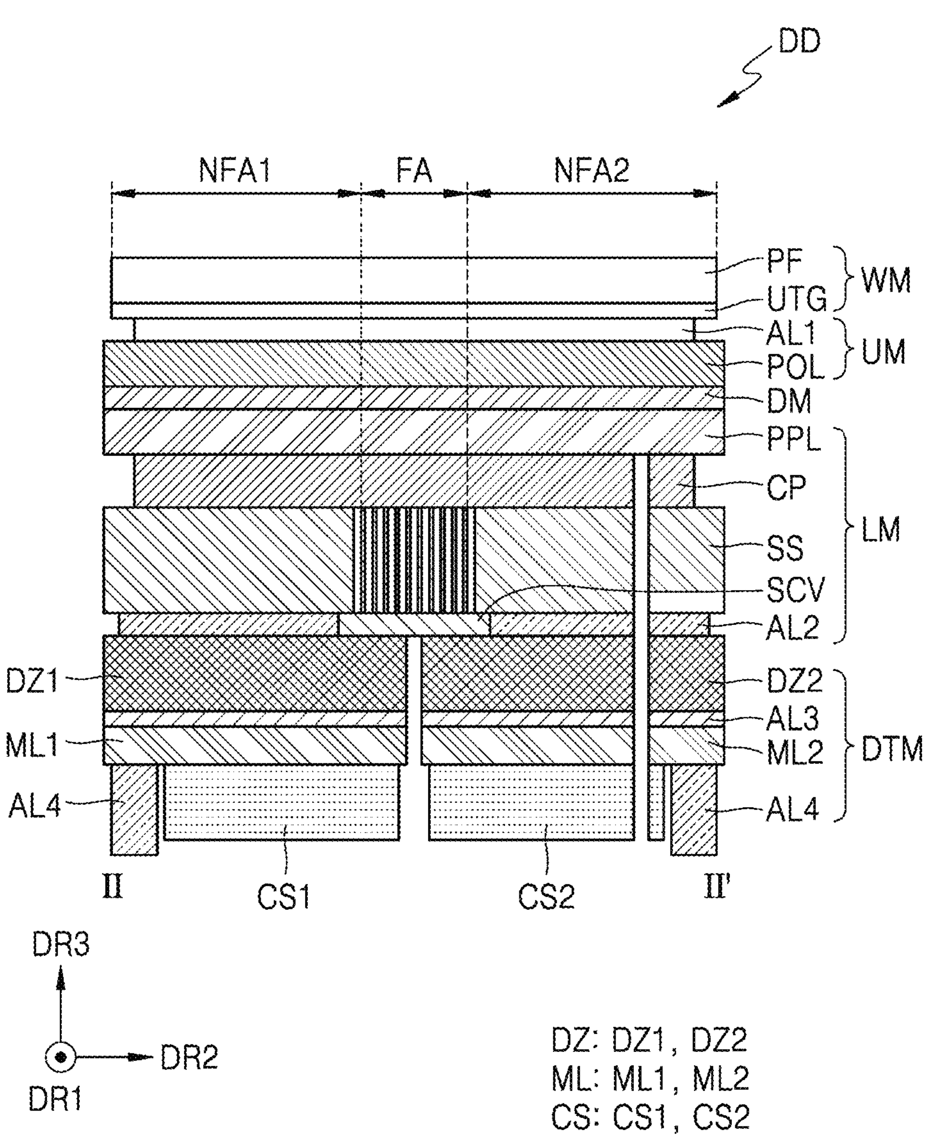
FIG. 6 is a side view of a display device taken along line II-II' of FIG. 3A.

FIG. 6 is a side view of a display device taken along line II-II' of FIG. 3A.

Referring to FIG. 6, the display device DD according to an embodiment may include the window WM, an upper member UM, the display module DM, a lower member LM, and a digitizer module DTM. The upper member UM may generally refer to a configuration positioned between the window WM and the display module DM, the lower member LM may generally refer to a configuration positioned between the display module DM and the digitizer module DTM, and the digitizer module DTM may generally refer to a configuration positioned below the lower member LM.

The display device DD may specifically include a window protection layer PF, a thin-film glass substrate UTG, a first adhesive layer AL1, a polarization member POL, a display module DM, a lower protection film PPL, a barrier member CP, a panel support SS, a second adhesive layer AL2, a digitizer DZ, a third adhesive layer AL3, a metal layer ML, a cushioning member CS, and a fourth adhesive layer AL4. In the claims, a side of the third direction DR3 with respect to a component may be expressed as an upper side, and the other side of the third direction DR3 may be expressed as a lower side.

In other words, the display device DD may include the display panel DP including a first non-folding area NFA1, a second non-folding area NFA2, and a folding area FA arranged between the first non-folding area NFA1 and the second non-folding area NFA2, the lower member LM arranged below the display panel DP, the digitizer module DTM arranged below the lower member LM, and a circuit board module CM arranged in an area below the digitizer module DTM. The lower member LM may include the panel support SS overlapping at least the first non-folding area NFA1 and the second non-folding area NFA2.

The first non-folding area NFA1, the folding area FA, and the second non-folding area NFA2 of the display device DD may be uniformly applied across various components of the display device DD, including the window protection layer PF, the thin-film glass substrate UTG, the first adhesive layer AL1, the display module DM, the lower protection film PPL, the barrier member CP, the panel support SS, the second adhesive layer AL2, the digitizer DZ, the third adhesive layer AL3, the metal layer ML, and the cushioning member CS. For example, a portion of the display module DM that overlaps the first non-folding area NFA1 of the display device DD in the third direction DR3 may become a first flat portion of the display module DM, a portion of the display module DM that overlaps the folding area FA of the display device DD in the third direction DR3 may become a first bending portion of the display module DM, and a portion of the display module DM that overlaps the second non-folding area NFA2 of the display device DD may become a second flat portion of the display module DM.

Likewise, a first display area DA1, a first non-display area NDA1, a second display area DA2, and a second non-display area NDA2 of the display device DD may be applied various components, including the window protection layer PF, the thin-film glass substrate UTG, the first adhesive layer AL1, the display module DM, the lower protection film PPL, the barrier member CP, the panel support SS, the second adhesive layer AL2, the digitizer DZ, the metal layer ML and the cushioning member CS, as described above.

The window protection layer PF may perform at least one of functions of preventing scattering, absorbing shock, preventing scratches, preventing fingerprints, and preventing glare of the thin-film glass substrate UTG, as described below. The window protection layer PF may be arranged on one side surface (hereinafter, referred to as a "top surface") of the thin-film glass substrate UTG in the third direction DR3. The window protection layer PF may be attached to the top surface of the thin-film glass substrate UTG via an adhesive agent such as a pressure-sensitive adhesive.

The thin-film glass substrate UTG may protect the display module DM to be described below from the outside. The thin-film glass substrate UTG may be arranged on one side surface (hereinafter, referred to as the "top surface") of the polarization member POL in the third direction DR3. The thin-film glass substrate UTG may include a transparent material, for example, glass or plastic. For example, a thin-film glass substrate UTG member may be ultra-thin glass having a thickness of 0.1 mm or less or a transparent polyimide film.

The thin-film glass substrate UTG may be attached to the top surface of the polarization member POL by the first adhesive layer AL1. The first adhesive layer AL1 may be a transparent adhesive film or a transparent adhesive resin.

The polarization member POL may polarize light emitted from the display module DM or polarize light incident to the display module DM. The polarization member POL may be arranged on one side surface (hereinafter, referred to as the "top surface") of the display module DM in the third direction DR3.

The polarization member POL may be omitted in some embodiments. When the polarization member POL is omitted, the thin-film glass substrate UTG may be attached to the top surface of the display module DM by the first adhesive layer AL1.

The display module DM is a panel that displays a screen, and any type of display module DM such as an organic light-emitting display module DM including an organic light-emitting layer, a micro light-emitting diode display module DM using a micro LED, a quantum dot light-emitting display module DM using a quantum dot light-emitting element (quantum dot LED) including a quantum dot light-emitting layer or an inorganic light-emitting display module DM using an inorganic light-emitting element including an inorganic semiconductor may be applied as the display module DM according to the current embodiment. In FIGS. 1A-C, the display module DM may display the screen on a side with respect to the third direction DR3.

The lower protection film PPL may support the display module DM and protect the bottom surface of the display module DM. The lower protection film PPL may be arranged on the other side surface (hereinafter, referred to as the "bottom surface") of the display module DM in the third direction DR3. The lower protection film PPL may be plastic such as polyethylene terephthalate or polyimide. In FIG. 6, the lower protection film PPL is shown as being arranged in the folding area FA of the display device DD, but the embodiment of the present specification is not limited thereto. For example, a panel cover layer SCV may be removed from the folding area FA of the display device DD and arranged only in the first non-folding area NFA1 and the first flat portion to allow the display device DD to be folded smoothly.

The barrier member CP may be arranged on the other side surface (hereinafter, referred to as the "bottom surface") of the lower protection film PPL in the third direction DR3. The barrier member CP may include at least one of a light-shielding layer for absorbing light incident from the outside, a cushioning layer for absorbing impact from the outside, and a heat-dissipation layer for efficiently dissipating heat of the display module DM.

The above-mentioned light-shielding layer blocks the transmission of light, thereby preventing components arranged under the light-shielding layer, for example, the digitizer DZ to be described later, from being visible from the top surface of the display module DM. The light-shielding layer may include a light-absorbing material such as a black pigment or a black dye.

The cushioning layer may absorb external impact and prevent the display module DM from being damaged. The cushioning layer may include a single layer or a plurality of layers. For example, the cushioning layer may include a polymer resin such as polyurethane, polycarbonate, polypropylene or polyethylene, or may include an elastic material such as a sponge formed by foaming rubber, a urethane material, or an acrylic material.

The heat-dissipation layer may include a first heat-dissipation layer including graphite or carbon nanotubes, and a second heat-dissipation layer including a metal thin film such as copper, nickel, ferrite, or silver that may shield electromagnetic waves and have excellent thermal conductivity.

The panel support SS may serve to support the bottom surface of the display module DM. The panel support SS may be arranged on the other side surface (hereinafter, referred to as the "bottom surface") of the barrier member CP in the third direction DR3. The panel support SS may be a rigid member having shape or volume that does not easily change with external pressure.

The panel support SS may include a grid pattern arranged to overlap the folding area FA so as to be easily bent in the folding area FA.

The cover layer SCV may be arranged on the other side surface (hereinafter, referred to as the "bottom surface") of the panel support SS in the third direction DR3. Specifically, the cover layer SCV may be arranged on an area overlapping the folding area FA in the third direction DR3 on the bottom surface of the panel support SS. The cover layer SCV may include an elastic material having a length that varies according to the folding and unfolding states of the display device DD.

The cover layer SCV may include a polymer material having a hyper elastic property. For example, the cover layer SCV may be elastic thermoplastic polyurethane (TPU). The cover layer SCV may have a thickness of 1 to 20 μm.

In some embodiments, the cover layer SCV may have a small modulus to correspond to the folding and unfolding states of the display device DD. For example, the cover layer SCV may include a material having a modulus of 1 Gigapascal (Gpa) or less.

The cover layer SCV may prevent foreign substances from entering the panel support SS from the outside.

The second adhesive layer AL2 may be arranged on the bottom surface of the panel support SS. Specifically, the second adhesive layer AL2 may be arranged in an area other than the area where the cover layer SCV is arranged on the bottom surface of the panel support SS. The second adhesive layer AL2 may fill a space between the panel support SS and the digitizer DZ to maximize a bonding area between the panel support SS and the digitizer DZ, and may securely fix the panel support SS to the digitizer DZ.

The second adhesive layer AL2 may include a pressure sensitive adhesive. When the adhesive member includes the pressure-sensitive adhesive, an adhesion force of the adhesive member to the panel support SS and/or the digitizer DZ may increase when pressure is applied to the adhesive member. For example, after the second adhesive layer AL2 including the pressure-sensitive adhesive is arranged between the panel support SS and the digitizer DZ, pressure may be applied to adhere the panel support SS to the digitizer DZ through the adhesive member.

The pressure-sensitive adhesive included in the second adhesive layer AL2 may include a natural rubber adhesive, a styrene/butadiene latex-based adhesive, an ABA block copolymer type thermoplastic rubber (herein, A is a thermoplastic polystyrene end block and B is a middle block of polyisoprene rubber, polybutadiene rubber, polyethylene rubber, or polybutylene rubber), an acrylic polymer adhesive such as butyl rubber, polyisobutylene, polyacrylate, a vinyl acetate/acrylic ester copolymer, and a vinyl ether polymer adhesive such as polyvinyl methyl ether, polyvinyl ethyl ether, and polyvinyl isobutyl ether.

A thickness of the second adhesive layer AL2 may be 15 μm or less. For example, the thickness of the second adhesive layer AL2 may be 10 μm but is not limited thereto.

The digitizer DZ may include a first digitizer DZ1 (e.g., a first sub-digitizer) and a second digitizer DZ2 (e.g., a second sub-digitizer). The first digitizer DZ1 and the second digitizer DZ2 may be arranged on the bottom surface of the panel support SS. The first digitizer DZ1 and the second digitizer DZ2 may be attached to the bottom surface of the panel support SS by the second adhesive layer AL2 as described above.

In an embodiment, the first digitizer DZ1 and the second digitizer DZ2 are not arranged in the folding area FA to reduce the folding stress of the display device DD. The first digitizer DZ1 may be arranged to overlap the first non-folding area NFA1, and the second digitizer DZ2 may be arranged to overlap the second flat portion of the second non-folding area NFA2. A gap between the first digitizer DZ1 and the second digitizer DZ2 may overlap the folding area FA and may be less than a width of the folding area FA in the second direction DR2.

The first digitizer DZ1 and the second digitizer DZ2 may include electrode patterns for detecting the approach or contact of an electronic pen, such as a stylus pen supporting electromagnetic induction. The first digitizer DZ1 and the second digitizer DZ2 may detect a magnetic field or an electromagnetic signal emitted from the electronic pen based on the electrode patterns, and determine, as touch coordinates, a point where the detected magnetic field or electromagnetic signal is greatest.

Magnetic metal powder may be arranged on the bottom surface of the first digitizer DZ1 and the bottom surface of the second digitizer DZ2. In this case, the magnetic field or electromagnetic signal passing through the first digitizer DZ1 and the second digitizer DZ2 may flow into the magnetic metal powder. Therefore, due to the magnetic metal powder, emission of the magnetic field or electromagnetic signal of the first digitizer DZ1 and the second digitizer DZ2 to the bottom surface of the display device DD may be reduced.

A third adhesive layer AL3 may be arranged on the bottom surface of the digitizer DZ. Specifically, the third adhesive layer AL3 may be arranged on the bottom surface of the first digitizer DZ1 and the bottom surface of the second digitizer DZ2 to cover the bottom surface of the first digitizer DZ1 and the bottom surface of the second digitizer DZ2. The third adhesive layer AL3 may fill the space between the digitizer DZ and the metal layer ML to maximize the bonding area between the digitizer DZ and the metal layer ML, and may securely fix the digitizer DZ to the metal layer ML.

The third adhesive layer AL3 may include substantially the same material as the second adhesive layer AL2 described above. Therefore, a separate description of AL3's material is not repeated since it is the same as AL2.

A thickness of the third adhesive layer AL3 may be 15 μm or less. For example, the thickness of the second adhesive layer AL2 may be 13 μm but is not limited thereto.

The metal layer ML may support the digitizer DZ. The metal layer ML may include a first metal layer ML1 and a second metal layer ML2. The first metal layer ML1 may be arranged on the other side surface (hereinafter referred to as the "bottom surface") of the first digitizer DZ1 in the third direction DR3, and the second metal layer ML2 may be arranged on the other side surface (hereinafter, referred to as the "bottom surface") of the second digitizer DZ2 in the third direction DR3.

In an embodiment, the first metal layer ML1 and the second metal layer ML2 do not overlap the folding area FA to reduce the folding stress of the display device DD. In other words, the first metal layer ML1 may be arranged to overlap the first non-folding area NFA1, and the second metal layer ML2 may be arranged to overlap the second non-folding area NFA2. A gap or space between the first metal layer ML1 and the second metal layer ML2 may overlap the folding area FA and may be less than a width of the folding area FA in the second direction DR2.

The first metal layer ML1 and the second metal layer ML2 may include a material having high rigidity. For example, the first metal layer ML1 and the second metal layer ML2 may include stainless steel such as SUS316 or copper (Cu).

The cushioning member CS (e.g., a coverlay structure) may include a first cushioning member CS1 (e.g., a first coverlay) and a second cushioning member CS2 (e.g., a second coverlay). The first cushioning member CS1 and the second cushioning member CS2 may absorb an external impact to prevent the panel support member SS and digitizer DZ member from being damaged. The first cushioning member CS1 and the second cushioning member CS2 may include an elastic material such as a sponge formed by foaming rubber, a urethane-based material, or an acrylic-based material.

The first cushioning member CS1 may be arranged on the bottom surface of the first metal layer ML1, and the second cushioning member CS2 may be arranged on the bottom surface of the second metal layer ML2. In an embodiment, the first cushioning member CS1 and the second cushioning member CS2 are not arranged in the folding area FA to reduce the folding stress of the display device DD. The first cushioning member CS1 may be arranged in the first non-folding area NFA1, and the second cushioning member CS2 may be arranged in the second non-folding area NFA2. The gap or space between the first cushioning member CS1 and the second cushioning member CS2 may overlap the folding area FA and may be less than the width of the folding area FA in the second direction DR2.

The fourth adhesive layer AL4 may prevent moisture or dust from penetrating into the display device DD. The fourth adhesive layer AL4 may be arranged on the other side surface (hereinafter, referred to as the "bottom surface") of the first metal layer ML1 in the third direction DR3 and the other side surface (hereinafter, referred to as the "bottom surface") of the second metal layer ML2 in the third direction DR3. The fourth adhesive layer AL4 may be arranged at the edge of the first metal layer ML1 and the edge of the second metal layer ML2. The fourth adhesive layer AL4 may be arranged to surround the first cushioning member CS1 and the second cushioning member CS2. The fourth adhesive layer AL4 may include a waterproof tape or waterproof member (not shown) that attaches the top surface of the frame arranged on the bottom surface of the first metal layer ML1 and the bottom surface of the cushioning member CS.

The fourth adhesive layer AL4 may be arranged to overlap a magnet for maintaining a second state of the display device DD in the third direction DR3 without surrounding the first cushioning member CS1 and the second cushioning member CS2. In this case, the fourth adhesive layer AL4 may serve as a magnetic shielding member capable of shielding magnetism to prevent a digitizer DZ member or the display module DM from being affected by the magnetism of the magnet.

Figure 7:
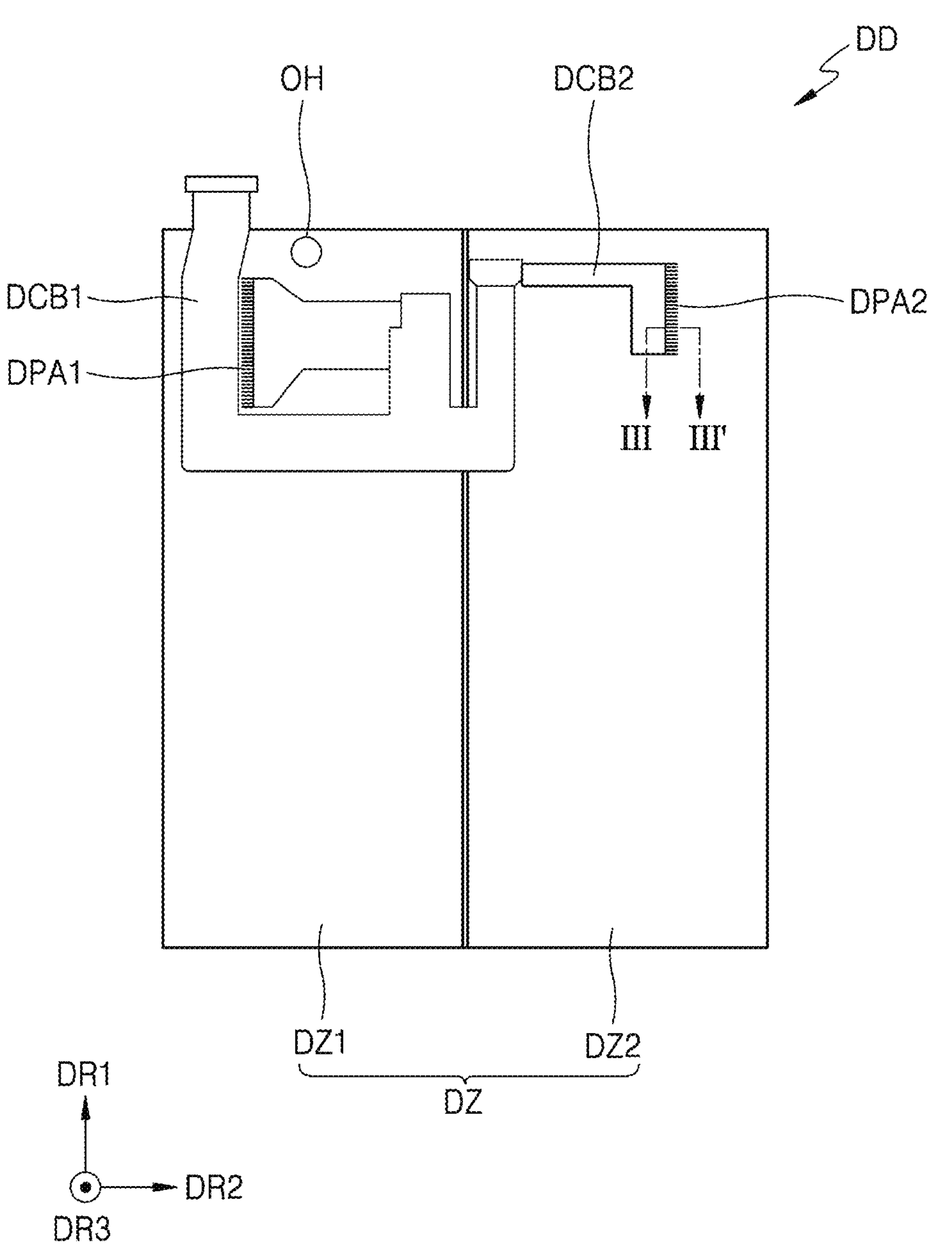
FIG. 7 is a plan view of a display device according to an embodiment of the present disclosure.

FIG. 7 is a plan view of a part of a display device according to an embodiment of the present disclosure. FIG. 7 is illustrated based on a state in which the display device DD shown in FIG. 6 is flipped over.

As shown in FIG. 7, the digitizer DZ may include the first digitizer DZ1 and the second digitizer DZ2 that are spaced apart from each other. A first circuit board DCB1 and a second circuit board DCB2 may be electrically connected to a first digitizer DZ1 and a second digitizer DZ2, respectively. The first circuit board DCB1 and the second circuit board DCB2 may electrically connect the first digitizer DZ1 and the second digitizer DZ2 to a main circuit board, respectively.

The first digitizer DZ1 and the second digitizer DZ2 may include a plurality of first loop coils and a plurality of second loop coils, respectively. The first loop coils may be referred to as driving coils, and the second loop coils may be referred to as detecting coils. The plurality of first loop coils and the plurality of second loop coils may be arranged in different layers.

The laminated structures of the first digitizer DZ1 and the second digitizer DZ2 may be the same as each other.

An opening hole OH corresponding to a through hole LTH of FIG. 7 may be defined in the first digitizer DZ1. The first circuit board DCB1 may be coupled to a first pad area DPA1 of the first digitizer DZ1, and a second circuit board DCB2 may be coupled to a second pad area DPA2 of the second digitizer DZ2. The corresponding circuit boards DCB1 and DCB2 and pad areas DPA1 and DPA2 may be electrically coupled through anisotropic conductive films (ACF). The pad areas DPA1 and DPA2 may correspond to a part of a region where the digitizer module DTM and the circuit board module CM overlap.

A circuit board DCB may have various shapes, and for example, the circuit board DCB may include the first circuit board DCB1 and the second circuit board DCB2. The first circuit board DCB1 and the second circuit board DCB2 may be circuit boards connected to the first digitizer DZ1 and the second digitizer, respectively, or may be a main circuit board and a sub-circuit board, respectively.

The first pad area DPA1 of the first digitizer DZ1 may be aligned with terminals of the first loop coils and the second loop coils, or terminals of signal lines connected to the first loop coils and the second loop coils. The second pad area DPA2 of the second digitizer DZ2 may be aligned with terminals of the first loop coils and the second loop coils, or the terminals of signal lines connected to the first loop coils and the second loop coils.

The pad areas (e.g., DPA1 or DPA2) may be defined as a region where the digitizer module DTM and the circuit board module CM are electrically connected with the anisotropic conductive film ACF therebetween when they are pressed. That is, the first pad area DPA1 may be a region where the first digitizer module DTM and the first circuit board module CM are electrically connected with the anisotropic conductive film ACF therebetween, and the second pad area DPA2 may be a region where the second digitizer module DTM and the second circuit board module CM are electrically connected with the anisotropic conductive film ACF therebetween.

However, as technology advances toward making the digitizer module DTM thinner, degradation of the surface quality of the region where it is pressed against the circuit board module CM may occur. Specifically, a main pressing area may include a region where the cushioning member CS of the digitizer module DTM is absent and a region where a protection member PS of the circuit board module CM is not present. Due to the reduced thickness in this area, the effects of pressing, including visible compression marks and step-induced bending, become more pronounced.

Hereinbelow, the display device DD for enhancing the surface quality through step compensation due to visibility of compression marks and step bending will be described.

Figure 8A:
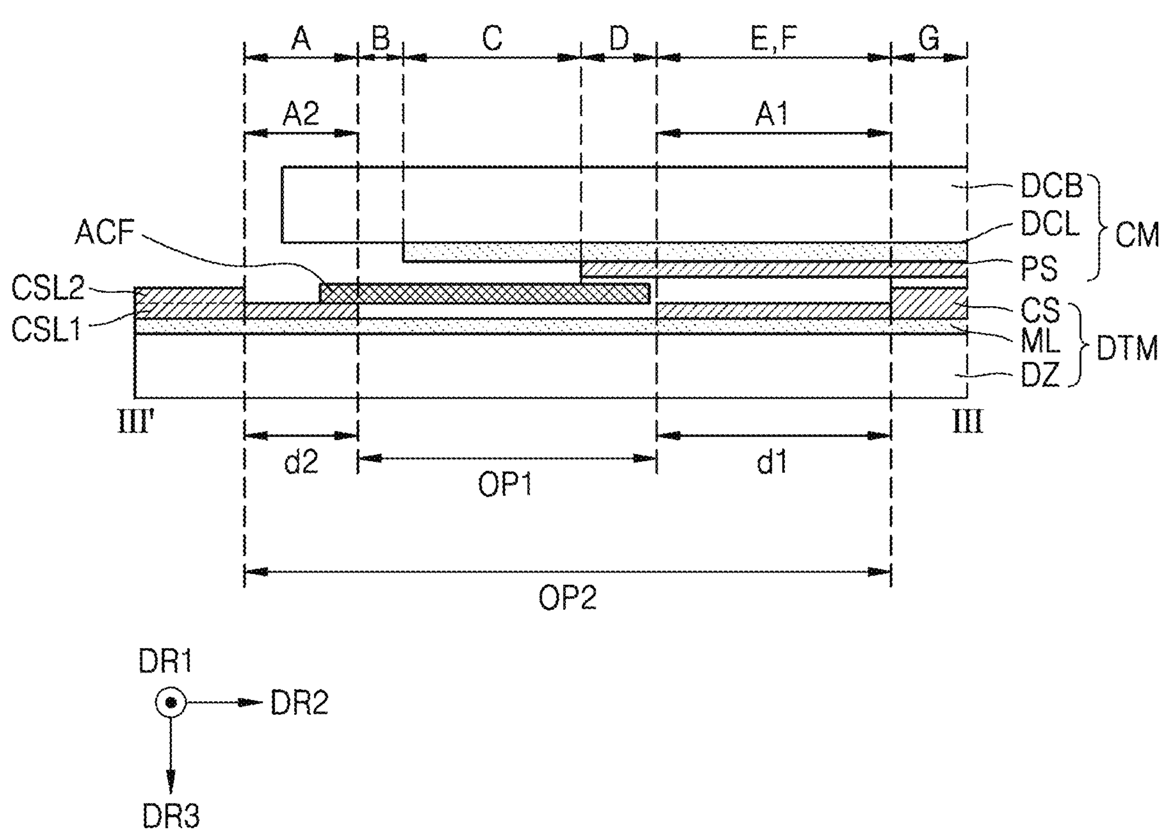
FIGS. 8A and 8B show an exploded perspective view and a cross-sectional view of an example taken along line III-III' of FIG. 7.
Figure 8B:
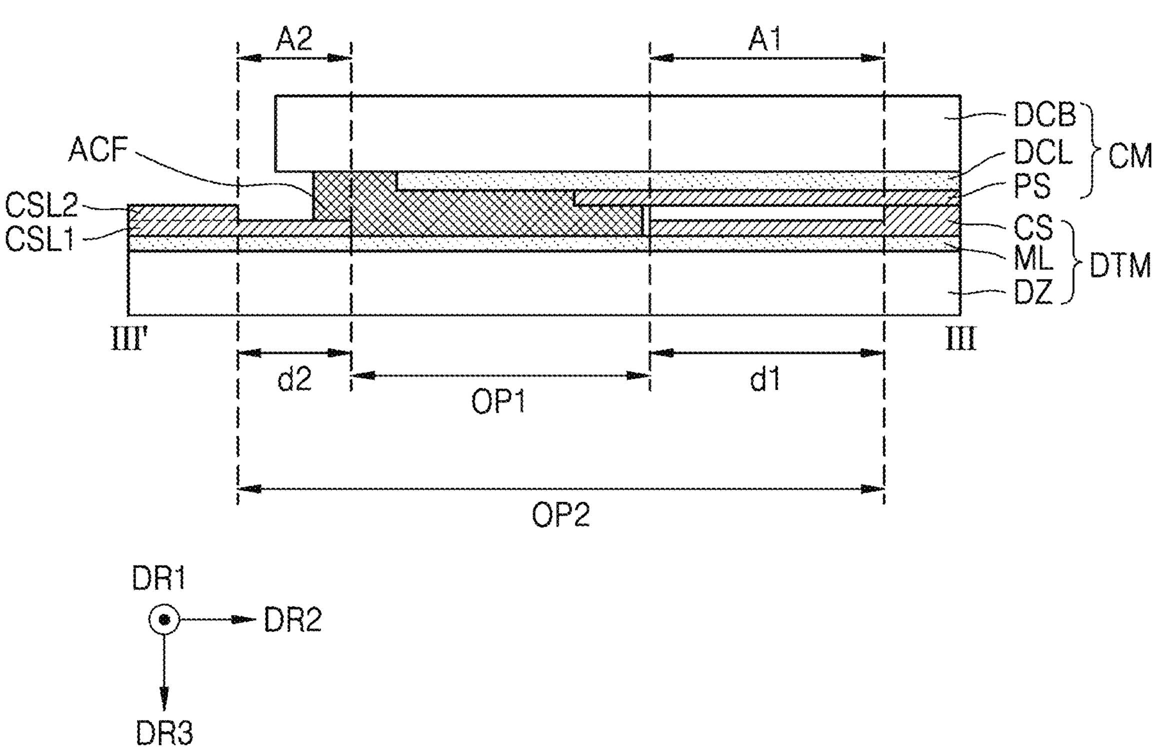
Figure 8C:
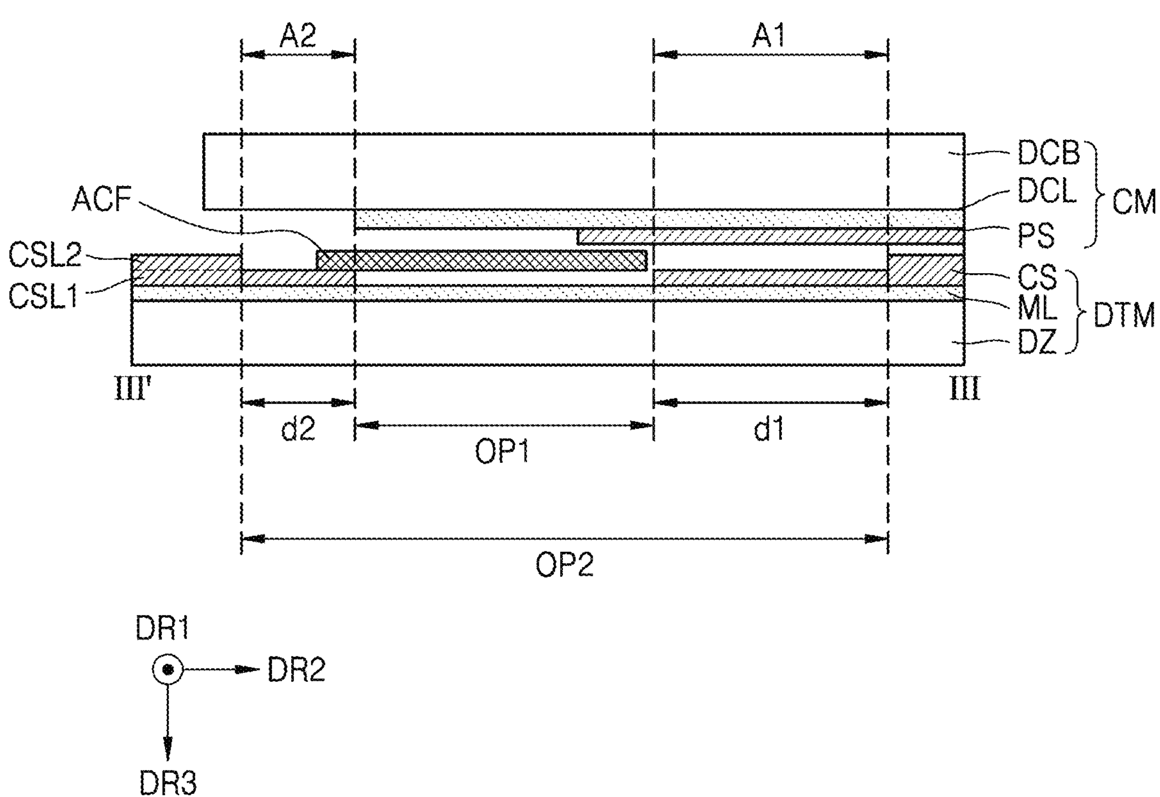
FIG. 8C is an exploded perspective view of another example taken along line III-III' of FIG. 7.

FIGS. 8A and 8B show an exploded perspective view and a cross-sectional view of an example taken along line III-III' of FIG. 7, and FIG. 8C is an exploded perspective view of another example taken along line III-III' of FIG. 7.

The drawings below illustrate the second digitizer DZ2 and the second circuit board DCB2 in the display device DD cut along line III-III' of FIG. 7, but the following description may be equally applied to the first digitizer DZ1 and the first circuit board DCB1. Therefore, for convenience, the second digitizer DZ2 will be described as the digitizer DZ and the second circuit board DCB2 as the circuit board DCB. The following description may be equally applied to the first digitizer DZ1 and the first circuit board DCB1.

In addition, FIGS. 8A to 8C are drawings cut along line III-III' of FIG. 7, illustrating the display device DD in a flipped state or flipped over as shown in FIG. 6. Therefore, these figures present exploded perspective and cross-sectional views from the flipped orientation. That is, a direction pointed by an arrow in the third direction DR3 shown in the drawing may be an upper side of the display device DD.

Referring to FIGS. 8A to 8C, the digitizer module DTM may include a loop coil, the digitizer DZ overlapping the first non-folding area NFA1 and the second non-folding area NFA2, the metal layer ML under the digitizer DZ, and the cushioning member CS under the metal layer ML. For example, FIGS. 8A to 8C are rotated 180 degrees, the metal layer ML would appear under the digitizer DZ, and the cushioning member CS would appear under the metal layer ML.

The digitizer DZ may generate data in response to an input from a pen or a stylus pen. At this time, the digitizer DZ may generate data using electromagnetic changes and electromagnetic induction.

As a user inputs light emitted by the display module DM onto the window WM with a pen, an area of the digitizer DZ may have correspond to an area of the display module DM and/or the window WM. The metal layer ML under the digitizer DZ may have an area corresponding to the area of the digitizer DZ.

The metal layer ML may support the digitizer DZ and allow the digitizer DZ and the circuit board DCB to be electrically connected through a first opening OP1 from which a portion of the cushioning member CS is removed.

The cushioning member CS arranged under the metal layer ML may protect the digitizer DZ from external impact. The cushioning member CS may have the first opening OP1 to expose a region of the metal layer ML such that the digitizer DZ and the circuit board DCB may be electrically connected in a desired region.

The cushioning member CS may include a material having insulating properties. For example, the cushioning member CS may include at least one of rubber, a urethane-based material, an acrylic-based material, polypropylene, polyethylene, glass fiber, ceramic, silicone, or epoxy resin.

The cushioning member CS may include a first cushioning layer CSL1 defining the first opening OP1 with a region thereof removed, and a second cushioning layer CSL2 arranged under the first cushioning layer CSL1 and overlapping the first opening OP1 and defining a second opening OP2 with a region thereof removed.

In other words, the cushioning member CS may include the first cushioning layer CSL1 and the second cushioning layer CSL2 under the first cushioning layer CSL1. A first surface of the first cushioning layer CSL1 may be in contact with the metal layer ML, and a second other surface of the first cushioning layer CSL1 opposing the first surface may be in contact with the second cushioning layer CSL2. The first cushioning layer CSL1 may define the first opening OP1 to expose a region of the metal layer ML, and the second cushioning layer CSL2 may define the second opening OP2 to overlap the first opening OP1 and expose the first cushioning layer CSL1 and a region of the metal layer ML. In an embodiment, the second opening OP2 is offset from the first opening OP1.

That is, since the first opening OP1 does not have the insulating cushioning member CS and the protection member PS described later, the digitizer DZ and the circuit board DCB may be electrically connected with the anisotropic conductive film ACF therebetween.

The second cushioning layer CSL2 defining the second opening OP2 and the circuit board module CM may be attached. In other words, the anisotropic conductive film ACF may be arranged in the first opening OP1 and the second opening OP2, and the circuit board module CM may be attached to the anisotropic conductive film ACF and the second cushioning layer CSL2.

By attaching the circuit board module CM to the second cushioning layer CSL2 rather than directly attaching the circuit board module CM to the first cushioning layer CSL1, the cushioning effect during pressing may be increased and the surface finish may be enhanced.

The circuit board module CM may include the circuit board DCB electrically connected to the digitizer DZ and arranged under the digitizer DZ, a circuit board lead DCL arranged on the circuit board DCB, and the protection member PS arranged on the circuit board lead DCL.

The circuit board DCB may be electrically connected to the digitizer module DTM and the main circuit board. The circuit board DCB may transmit data generated from the digitizer DZ to the main circuit board.

The circuit board lead DCL may be arranged between the circuit board DCB and the digitizer module DTM. The circuit board lead DCL may include a conductive material to enable the digitizer DZ and the circuit board DCB to be electrically connected when the digitizer module DTM and the circuit board module CM are pressed together. In other words, a region of the circuit board lead DCL overlaps the first opening OP1 of the digitizer module DTM such that the digitizer DZ and the circuit board DCB may be electrically connected with the anisotropic conductive film ACF therebetween.

The circuit board lead DCL may include a metal, for example, one of copper, silver, gold, nickel, or tin. The circuit board lead DCL may have a risk of corrosion, such that the circuit board DCB may extend outwardly from the circuit board lead DCL to protect the circuit board lead DCL. As an end of the circuit board DCB extends outwardly further than an end of the circuit board lead DCL, a step occurrence region may be dispersed more evenly, enhancing surface quality and compensating for any tolerance variations that may occur at the pressing tool's position.

The protection member PS arranged between the circuit board lead DCL and the digitizer module DTM may protect the circuit board lead DCL from corrosion and a force applied in pressing.

By controlling the length of the protection member PS, a desired region of the circuit board lead DCL may overlap the first opening OP1 and the anisotropic conductive film ACF, thereby controlling a region where the digitizer DZ and the circuit board DCB are electrically connected.

The protection member PS may include a material having cushioning and insulating properties. For example, the protection member PS may include at least one of rubber, a urethane-based material, an acrylic-based material, polypropylene, polyethylene, glass fiber, ceramic, silicone, or epoxy resin.

The circuit board lead DCL may extend outwardly from at least the protection member PS to electrically connect the digitizer DZ and the circuit board DCB. As the circuit board lead DCL extends further outward beyond the protection member PS, the ends of the circuit board lead DCL and the protection member PS may be spaced apart from each other, thereby reducing the step difference, specifically by compensating for the step with the first opening OP1. This configuration helps mitigate the risk of reducing the contact area of a pressing portion during the pressing of the digitizer module DTM and the circuit board module CM.

A discussion follows for reducing the step difference between regions in the total thickness of the circuit board module CM and the digitizer module DTM pressed together.

The protection member PS may at least partially overlap the anisotropic conductive film ACF, with its outer end positioned in the first opening OP1. This arrangement disperses or distributes the terminals of the protection member PS, the anisotropic conductive film ACF, and the first opening OP1, effectively preventing a step difference from being concentrated in a narrow area across each region. As a result, the reliability of the display device DD may be enhanced due to the low-pressure compression between the protection member PS and the cushioning member CS, providing an protection against external condensation.

A region of the second opening OP2 that does not overlap the first opening OP1 may include a first area A1 overlapping the protection member PS and a second area A2 not overlapping the protection member PS.

In an embodiment, a first width d1 that is a width of the first area A1 is greater than a second width d2 that is a width of the second area A2. As a result, in regions where steps frequently occur, such as regions where the first opening OP1, the second opening OP2, the anisotropic conductive film ACF, and the protection member PS are densely located, the terminals may be dispersed to reduce the step difference between regions, and the parts may be prevented from drooping due to the steps.

The outer end of the circuit board lead DCL may correspond to the inner end of the second area A2. Specifically, the step difference may be further reduced by making the outer end of the circuit board lead DCL coincide with the inner surface of the first opening OP1 at the inner end of the second area A2.

The outer end of the circuit board DCB may be located on the second area A2 or the second cushioning layer CSL2. When the outer end of the circuit board DCB is located in the second area A2, the step occurrence area may be distributed closer to the outer end of the second area A2. When the outer end of the circuit board DCB is positioned on the second cushioning layer CSL2, the step occurrence area may be dispersed and the second cushioning layer CSL2 may alleviate a force during pressing, thereby reducing the visibility of the pressing mark.

The digitizer module DTM and the circuit board module CM may be bonded by the anisotropic conductive film ACF. The anisotropic conductive film ACF may be conductive. For example, the anisotropic conductive film ACF may include an organic polymer and a plurality of conductive balls included in the organic polymer.

The organic polymer may be a curable resin that has adhesive properties and may be cured by heat or light. The curable resin may include a thermosetting resin, and include, but is not limited to, a bisphenol A type epoxy resin, a bisphenol F type epoxy resin, a novolac type epoxy resin, a phenol resin, a urea resin, a melamine resin, an unsaturated polyester resin or a resorcinol resin. The thermoplastic resin may include, but is not limited to, a saturated polyester resin, a vinyl resin, an acrylic resin, a polyolefin resin, a polyvinylacetate (PVA) resin, a polycarbonate resin, a cellulose resin, a ketone resin, a styrene resin, and the like.

The conductive balls may include metals such as gold, silver, tin, nickel, chromium, iron, cobalt, platinum, copper, and alloys thereof, or may include a core including glass, ceramic, or polymer resin, and the metals and alloys thereof formed on the surface of the core.

That is, when the digitizer module DTM and the circuit board module CM are pressed with the anisotropic conductive film ACF therebetween, the digitizer module DTM and the circuit board module CM may be electrically connected to each other through the conductive balls.

The anisotropic conductive film ACF may be arranged in a region overlapping at least the circuit board lead DCL in the first opening OP1. This allows the circuit board lead DCL and the metal layer ML to be electrically connected to each other. The anisotropic conductive film ACF may be manufactured by pressing the anisotropic conductive resin with heat or pressure. At this time, the anisotropic challenge resin, while being pressed, may be further expanded from a position where it is arranged before pressing. For example, the anisotropic conductive resin may expand further from its initial position upon being pressed. For example, the anisotropic conductive resin may cover the entire metal layer ML while being pressed, and furthermore, may flow to the area E of FIG. 8A.

The anisotropic conductive film ACF may cover at least a part of the second area A2. This may protect the circuit board lead DCL from external substances even when the digitizer DZ and circuit board DCB are pressed. The outer end of the protection member PS and the terminal of the anisotropic conductive film ACF may be moved further apart, thereby reducing the step difference.

Figure 8D:
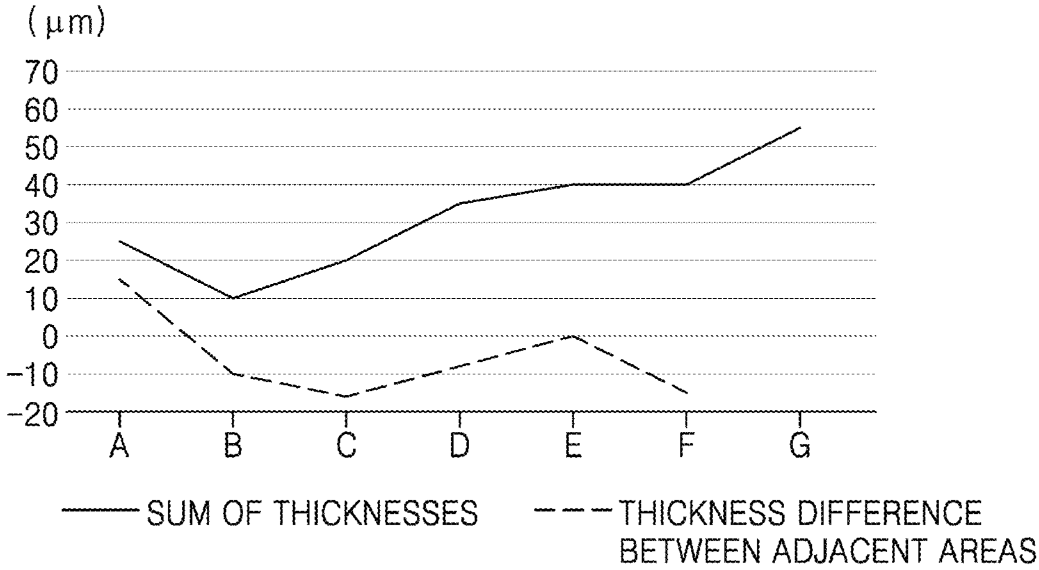
FIG. 8D is a graph showing a sum of thicknesses of a digitizer module and a circuit board module and a thickness difference between adjacent areas, taken along line III-III' of FIG. 7.

FIG. 8D is a graph showing a sum of thicknesses of a digitizer module and a circuit board module and a thickness difference between adjacent areas, taken along line III-III' of FIG. 7.

In an embodiment of the present disclosure, a thickness distance in the entire region where the digitizer module DTM and the circuit board module CM are pressed and a thickness difference between adjacent areas are measured.

In an example, the thicknesses of components are set to 10 for the circuit board lead DCL, 15.5 for the protection member PS, 25 for the anisotropic conductive film ACF, 15.5 for the second cushioning layer CSL2, and 15.5 for the first cushioning layer CSL1, respectively.

Regions A, B, C, D, E, F, and G in the following table and FIG. 8D correspond to the regions A, B, C, D, E, F, and G shown in FIG. 8A. Specifically, the area A represents a second width d2 of the second area A2, the area B represents a distance from an inner end of the second area A2 to an outer end of the circuit board lead DCL, the area C represents a width of a region where the circuit board lead DCL does not overlap the protection member PS, the area D represents a distance from an outer end of the protection member PS to an inner end of the first opening OP1, the regions E and F represent the first width d1 of the first area A1, and the area G represents a region where the second cushioning layer CSL2 and the protection member PS overlap. The area A, the area B, the area C, the area D, the area E, the area F, and the area G may be connected to each other in order.

TABLE 1

| <Experimental Example> | | | | | | | | |
|---|---|---|---|---|---|---|---|---|
| Item | Design Thickness (μm) | Area A | Area B | Area C | Area D | Area E | Area F | Area G |
| Circuit Board | | | | | | | | |
| Circuit Board Lead | 10 | | | 10 | 10 | 10 | 10 | 10 |
| Protection Member | 15.5 | | | | 15.5 | 15.5 | 15.5 | 15.5 |
| Anisotrpoic Conductive Film | 25 | 10 | 10 | 10 | 10 | | | |
| Second Cushioning Layer | 15.5 | | | | | | | 15.5 |
| First Cushioning Layer | 15.5 | 15.5 | | | | 15.5 | 15.5 | 15.5 |
| Metal Layer | | | | | | | | |
| Thickness Distance | | 25.5 | 10 | 20 | 35.5 | 41 | 41 | 56.5 |
| Thickness Difference between Adjacent Areas | | 15.5 | −10 | −15.5 | −5.5 | 0 | −15.5 | |

Figure 9A:
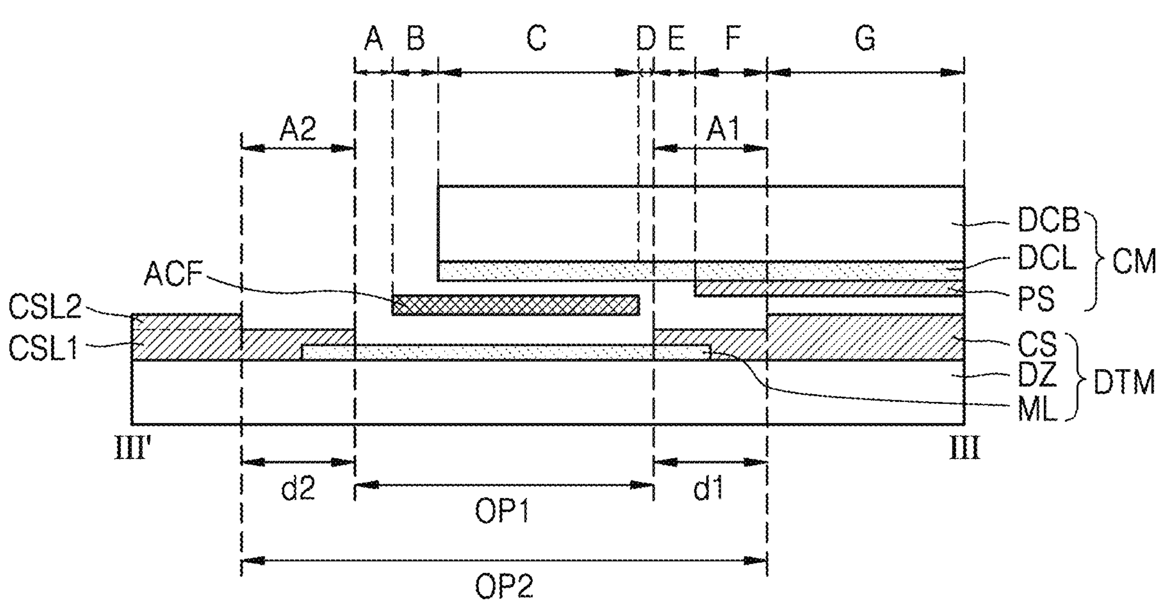
FIG. 9A is an exploded perspective view of a display device taken along line III-III' of FIG. 7, according to a comparative example with respect to the present disclosure.
Figure 9A:
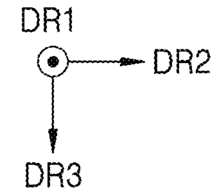
Figure 9B:
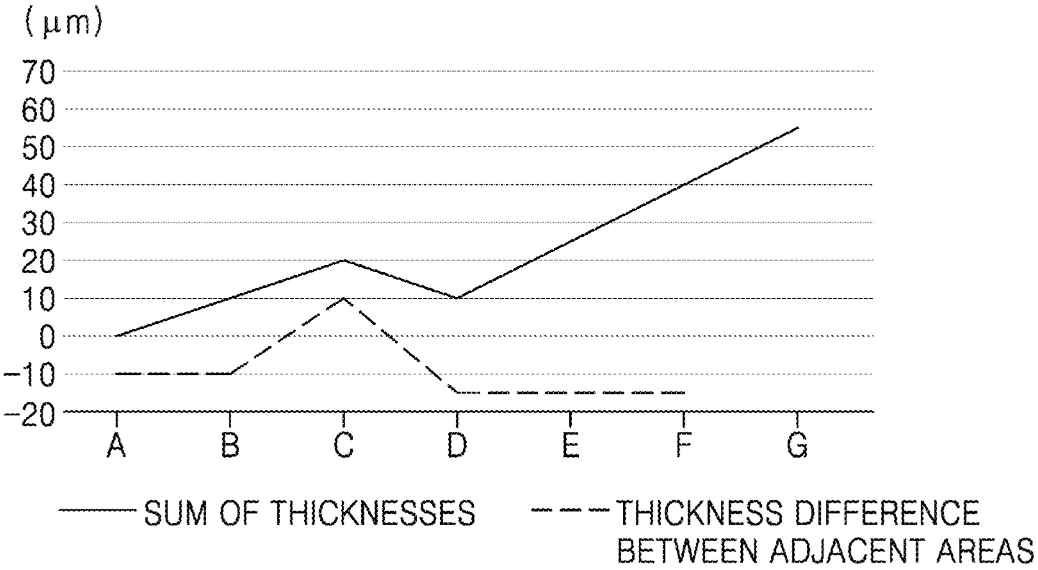
FIG. 9B is a graph showing a sum of thicknesses of a digitizer module and a circuit board module, taken along line III-III' of FIG. 7, and a thickness difference between adjacent areas, according to a comparative example with respect to the present disclosure.

FIG. 9B is a graph obtained by measuring a thickness distance in the entire area where the digitizer module DTM and the circuit board module CM are pressed and a thickness difference between adjacent areas in the foregoing comparative example.

The evaluation of the experimental data below is described by comparison with FIG. 9B which describes a comparative example.

FIG. 9A is an exploded perspective view of a display device taken along line III-III' of FIG. 7, according to a comparative example with respect to the present disclosure, and FIG. 9B is a graph showing a sum of thicknesses of a digitizer module and a circuit board module, taken along line III-III' of FIG. 7, and a thickness difference between adjacent areas, according to a comparative example with respect to the present disclosure.

FIG. 9A is an example of a display device to be compared with the present disclosure. The display device of this comparative example has a shorter circuit board DCB and circuit board lead DCL than the display device DD of the present disclosure, and the outer ends of the circuit board DCB and the circuit board lead DCL are aligned. Additionally, the anisotropic conductive film (ACF) does not cover an area of the first cushioning layer CSL1, and the protection member PS also does not cover an area of the anisotropic conductive film (ACF). The first width d1 and the second width d2 are equal.

In this comparative example, the thicknesses of the components were set to 10 μm for the circuit board lead DCL, 15.5 μm for the protection member PS, 25 μm for the anisotropic conductive film ACF, 15.5 μm for the second cushioning layer CSL2, and 15.5 μm for the first cushioning layer CSL1, respectively.

Areas A, B, C, D, E, F, and G in the following table and FIG. 9B correspond to areas A, B, C, D, E, F, and G shown in FIG. 9A. Specifically, the area A represents a second width d2 of the second area A2, the area B represents a distance from an inner end of the second area A2 to an outer end of the circuit board lead DCL, the area C represents a width of a region where the circuit board lead DCL does not overlap the protection member PS, the area D represents a distance from an outer end of the protection member PS to an inner end of the first opening OP1, the regions E and F represent the first width d1 of the first area A1, and the area G represents a region where the second cushioning layer CSL-2 and the protection member PS overlap. The area A, the area B, the area C, the area D, the area E, the area F, and the area G may be connected to each other in order.

TABLE 2

| <Comparative Example> | | | | | | | | |
|---|---|---|---|---|---|---|---|---|
| Item | Design Thickness (μm) | Area A | Area B | Area C | Area D | Area E | Area F | Area G |
| Circuit Board | | | | | | | | |
| Circuit Board Lead | 10 | | | 10 | 10 | 10 | 10 | 10 |
| Protection Member | 15.5 | | | | | | 15.5 | 15.5 |

TABLE 2-continued

<Comparative Example>

| Item | Design Thickness (μm) | Area A | Area B | Area C | Area D | Area E | Area F | Area G |
|---|---|---|---|---|---|---|---|---|
| Anisotrpoic Conductive Film | 25 | | 10 | 10 | | | | |
| Second Cushioning Layer | 15.5 | | | | | | | 15.5 |
| First Cushioning Layer | 15.5 | 15.5 | | | | 15.5 | 15.5 | 15.5 |
| Metal Layer | | | | | | | | |
| Thickness Distance | | 0 | 10 | 20 | 10 | 25.5 | 41 | 56.5 |
| Thickness Difference between Adjacent Areas | | −10 | −10 | 10 | −15.5 | −15.5 | −15.5 | |

In the comparative example, the width of the anisotropic conductive film ACF is small, and specifically, as a compensation area (the areas B and C) of the anisotropic conductive film (ACF) is insufficient, a section for compensating for the step is narrow. As a result, an increase in thickness distance over the entire pressed area is large at a maximum of 56.5 μm, resulting in poor surface quality.

However, in the embodiment, the width of the anisotropic conductive film ACF is relatively large, and specifically, as the step compensation section is filled with the anisotropic conductive film ACF due to expansion of the compensation area (the areas A to D) of the anisotropic conductive film ACF. As a result, the increase in thickness distance of the entire pressed area is reduced to a maximum of 31 μm compared to the comparative example. Compared to the comparative example, the thickness step in the current embodiment is reduced by 55%, thereby enhancing surface quality.

The display device DD according to the present disclosure may enhance the visibility of surface quality by compensating for step differences in the pressed area of each component within the digitizer module DTM and the circuit board module CM. Additionally, it may prevent drooping due to thickness variations around the pressed area.

Figure 10:
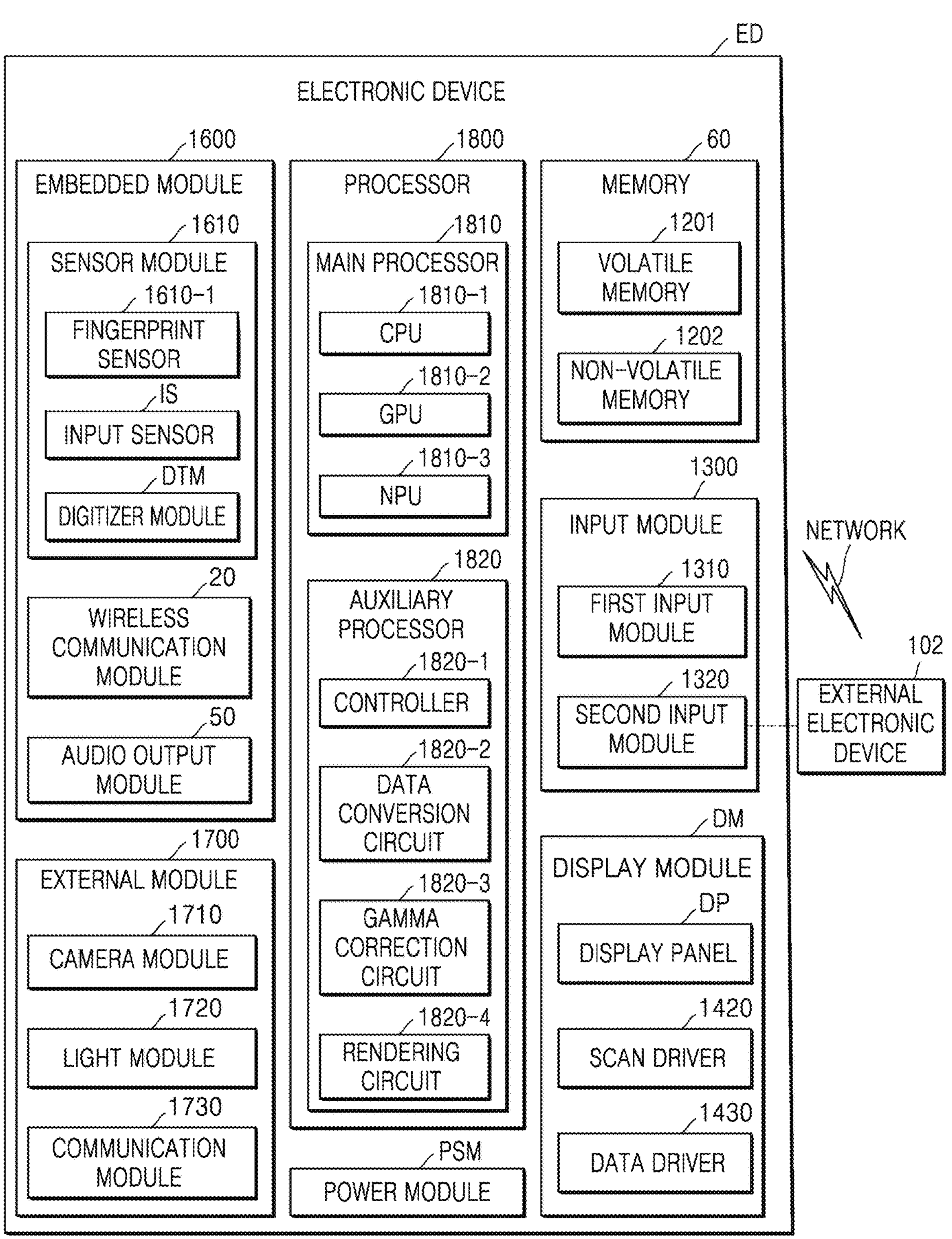
FIG. 10 is a block diagram of an electronic device according to an embodiment of the present disclosure.

FIG. 10 is a block diagram of an electronic device according to an embodiment of the present disclosure.

The electronic device ED may output various information through the display module DM within an operating system. When a processor 1800 executes an application stored in a memory 60, the display module DM may provide application information to the user through the display panel DP.

The processor 1800 may obtain an external input through an input module 1300 or a sensor module 1610 and execute an application corresponding to the external input. For example, when the user selects a camera icon displayed on the display panel DP, the processor 1800 may obtain a user input through the input sensor IS and activate a camera module 1710. The processor 1800 may transmit image data corresponding to a captured image obtained through the camera module 1710 to the display module DM. The display module DM may display an image corresponding to the captured image through the display panel DP.

In another example, when personal information authentication is performed in the display module DM, a fingerprint sensor 1610-1 may obtain the input fingerprint information as input data. The processor 1800 may compare the input data obtained through the fingerprint sensor 1610-1 with authentication data stored in the memory 60 and execute an application based on a comparison result. The display module DM may display information executed according to application's logic through the display panel DP.

In another example, when a music streaming icon displayed on the display module DM is selected, the processor 1800 may obtain a user input through the input sensor IS and activate the music streaming application stored in the memory 60. When a music execution command is input in the music streaming application, the processor 1800 may activate an audio output module 50 to provide the user with audio information corresponding to the music execution command.

So far, the operation of the electronic device ED has been briefly described. The configuration of the electronic device ED will be described in detail below. Some of the components of the electronic device ED described below may be integrated and provided as one component, or one component may be provided separately as two or more components.

Referring to FIG. 10, the electronic device ED may communicate with an external electronic device 102 via a network (e.g., a short-range wireless communication network or a long-range wireless communication network). According to an embodiment, the electronic device ED may include the processor 1800 that operates by executing at least one program, the memory 60 that stores at least one program, the input module 1300, the display module DM, and the power module PSM that supplies power to the display module DM.

The electronic device ED may also include an embedded module 1600 and an external module 1700. The embedded module 1600 may include the sensor module 1610 that detects an input and generates data corresponding to the input, a wireless communication module 20 that transmits or receives data or power to an external electronic device, and the audio output module 50 that controls the processor 1800 to output data audibly. The external module 1700 may include a camera module 1710 for capturing still images and/or moving images, a light module 1720 for outputting light, and a communication module 1730 for transmitting or receiving data between the electronic device ED and the external electronic device 102.

According to an embodiment, the electronic device ED may omit at least one of the above-described components, or may have one or more other components added. According to an embodiment, some of the components described above (e.g., the sensor module 1610, the wireless communication module 20, or the audio output module 50) may be integrated into another component (e.g., the display module DM).

The processor 124 may execute software to control at least one other component (e.g., a hardware or software component) of the electronic device ED connected to the processor 1800 and may process or compute various data. According to an embodiment of the disclosure, the processor 1800 as at least a part of data processing or operations may store a command or data received from another component (e.g., the input module 1300, the sensor module 1610, or the communication module 1730) in the volatile memory 1201, process the command or data stored in the volatile memory 1201, and store resulting data in the non-volatile memory 1202.

The processor 1800 may include a main processor 1810 and an auxiliary processor 1820. The main processor 1810 may include one or more of a central processing unit (CPU) 1810-1 or an application processor (AP). The main processor 1810 may further include any one or more of a graphic processing unit (GPU) 1810-2, a communication processor (CP), and an image signal processor (ISP). The main processor 1810 may further include a neural processing unit (NPU) 1810-3. The NPU 1810-3 may be a processor specialized in processing an AI model that may be generated through machine learning. The AI model may include a plurality of artificial neural network layers. The artificial neural network may be, but not limited to, a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof. The AI model may additionally or alternatively include a software structure as well as the hardware structure. At least two of the processing unit and the processor described above may be implemented as a single integrated configuration (e.g., a single chip) or each may be implemented as an independent configuration (e.g., a plurality of chips).

The auxiliary processor 1820 may include a controller 1820-1. The controller 1820-1 may include an interface conversion circuit and a timing control circuit. The controller 1820-1 may receive an image signal from the main processor 181, convert a data format of the image signal to match interface specifications with the display module DM, and output the image data. The controller 1820-1 may output various control signals necessary for driving the display module DM.

The auxiliary processor 1820 may further include a data conversion circuit 1820-2, a gamma correction circuit 1820-3, a rendering circuit 1820-4, etc. The data conversion circuit 1820-2 may receive image data from the controller 1820-1 and compensate for the image data to display the image at a desired brightness according to the characteristics of the electronic device ED, the user's settings, etc., or convert the image data to reduce power consumption or compensate for afterimages. The gamma correction circuit 1820-3 may convert the image data or a gamma reference voltage, etc. such that the image displayed on the electronic device ED has desired gamma characteristics. The rendering circuit 1820-4 may receive the image data from the controller 1820-1 and render the image data by taking into consideration the pixel layout of the display panel DP applied to the electronic device ED. At least one of the data conversion circuit 1820-2, the gamma correction circuit 1820-3, and the rendering circuit 1820-4 may be integrated into another component (e.g., the main processor 1810 or the controller 1820-1). At least one of the data conversion circuit 1820-2, the gamma correction circuit 1820-3, and the rendering circuit 1820-4 may be integrated into a data driver 1430 described below.

The memory 60 may store various data used by at least one component of the electronic device ED (e.g., the processor 1800 or the sensor module 1610) and input data or output data for commands related thereto. The memory 60 may include at least one of a volatile memory 1201 and a non-volatile memory 1202.

The input module 1300 may receive commands or data to be used for components of the electronic device ED (e.g., the processor 1800, the sensor module 1610, or the audio output module 50) from an external source of the electronic device ED (e.g., the user or the external electronic device 102).

The input module 1300 may include a first input module 1310 into which a command or data is input from the user and a second input module 1320 into which a command or data is input from the external electronic device 102. The first input module 1310 may include a microphone, a mouse, a keyboard, a key (e.g., a button), or a pen (e.g., a passive pen or an active pen). The second input module 1320 may support a designated protocol that may be connected wired or wirelessly to the external electronic device 102. According to an embodiment, the second input module 1320 may include, for example, a high definition multimedia interface (HDMI), a universal serial bus (USB) interface, a secure digital (SD) card interface, or an audio interface. The second input module 1320 may include a connector that may be physically connected to the external electronic device 102, for example, an HDMI connector, a USB connector, an SD card connector, or an audio connector (e.g., a headphone connector).

The display module DM may visually provide information to the user. The display module DM may include the display panel DP, a scan driver 1420, and the data driver 1430. The display module DM may further include a window, a chassis, and a bracket to protect the display panel DP.

The display panel DP may include a liquid crystal display panel, an organic light-emitting display panel, or an inorganic light-emitting display panel, and the type of the display panel DP is not particularly limited. The display panel DP may be of a rigid type or of a flexible type capable of rolling or folding. The display module DM may further include a supporter, a bracket, or a heat-dissipation member that supports the display panel DP.

The scan driver 1420 may be mounted on the display panel DP as a driving chip. The scan driver 1420 may be integrated into the display panel DP. For example, the scan driver 1420 may include an amorphous silicon TFT gate driver circuit (ASG), a low-temperature polycrystalline silicon TFT gate driver circuit (LTPS), or an oxide semiconductor TFT gate driver circuit (OSG) embedded in the display panel DP. The scan driver 1420 may receive a control signal from the controller 1820-1 and output a scan signal to the display panel DP in response to the control signal.

The display panel DP may further include a light-emitting driver. The light-emitting driver may output a light-emitting control signal to the display panel DP in response to the control signal received from the controller 1820-1. The light-emitting driver may be formed separately from the scan driver 1420 or may be integrated into the scan driver 1420.

The data driver 1430 may receive the control signal from the controller 1820-1, convert image data into an analog voltage (e.g., a data voltage) in response to the control signal, and then output the data voltage to the display panel DP.

The data driver 1430 may be integrated into another component (e.g., the controller 1820-1). The functions of the interface conversion circuit and the timing control circuit of the above-described controller 1820-1 may be integrated into the data driver 1430.

The display module DM may further include a light-emitting driver and a voltage generation circuit. The voltage generation circuit may output various voltages required to drive the display panel DP.

The power module PSM may supply power to the components of the electronic device ED. The power module PSM may include a battery that charges a power voltage. The battery may include a non-rechargeable primary battery, a rechargeable secondary battery, or a fuel cell. The power module PSM may include a power management integrated circuit (PMIC). The PMIC may provide optimized power for each of the modules described above and below. The power module PSM may include a wireless power transmission/reception member electrically connected to the battery. The wireless power transmission/reception member may include a plurality of coil-shaped antenna radiators.

The electronic device ED may further include an embedded module 1600 and an external module 1700. The embedded module 1600 may include the sensor module 1610, the wireless communication module 20, and the audio output module 50. The external module 1700 may include the camera module 1710, the light module 1720, and the communication module 1730.

The sensor module 1610 may detect an input by the user's body or an input by the pen of the first input module 1310 and generate an electric signal or data value corresponding to the input. The sensor module 1610 may include at least one of the fingerprint sensor 1610-1, the input sensor IS, and the digitizer module DTM.

The fingerprint sensor 1610-1 may generate a data value corresponding to the user's fingerprint. The fingerprint sensor 1610-1 may include either an optical fingerprint sensor or a capacitive fingerprint sensor.

The input sensor IS may generate a data value corresponding to coordinate information of the input by the user's body or the input by the pen. The input sensor IS may generate, as the data value, a change in capacitance due to the input. The input sensor IS may detect an input from a passive pen or transmit and receive data with an active pen.

The input sensors IS may also measure bio-signals such as blood pressure, moisture, or body fat. For example, when the user touches the body part to a sensor layer or a sensing panel and does not move for a certain period of time, the input sensor IS may detect a bio signal based on a change in an electric field due to the body part and output the user-desired information to the display module DM.

The digitizer module DTM may generate a data value corresponding to coordinate information input by the pen. The digitizer module DTM may generate, as a data value, an electromagnetic change due to the input. The digitizer module DTM may detect an input from a passive pen or transmit and receive data with an active pen.

At least one of the fingerprint sensor 1610-1, the input sensor IS, and the digitizer module DTM may be implemented as a sensor layer formed on the display panel DP through a continuous process. The fingerprint sensor 1610-1, the input sensor IS, and the digitizer module DTM may be arranged on the display panel DP, and one of the fingerprint sensor 1610-1, the input sensor IS, and the digitizer module DTM, for example, the digitizer module DTM, may be arranged under the display panel DP.

At least two of the fingerprint sensor 1610-1, the input sensor IS, and the digitizer module DTM may be formed to be integrated into one sensing panel through the same process. When integrated into one sensing panel, the sensing panel may be arranged between the display panel DP and a window arranged on the display panel DP. According to an embodiment, the sensing panel may be arranged on the window, and the position of the sensing panel is not particularly limited.

At least one of the fingerprint sensor 1610-1, the input sensor IS, and the digitizer module DTM may be embedded in the display panel DP. That is, through a process of forming elements (e.g., light-emitting elements, transistors, etc.) included in the display panel DP, at least one of the fingerprint sensor 1610-1, the input sensor IS, and the digitizer module DTM may be formed at the same time.

The sensor module 1610 may generate an electrical signal or a data value corresponding to an internal or external state of the electronic device ED. The sensor module 1610 may further include a gesture sensor, a gyro sensor, a pressure sensor, a magnetic sensor, an acceleration sensor, a grip sensor, a proximity sensor, a color sensor, an IR ray sensor, a vivo sensor, a temperature sensor, a humidity sensor, and/or an illuminance sensor.

The wireless communication module 20 may include one or more antennas for transmitting a signal or power to the outside or receiving a signal or power from the outside. According to an embodiment, the communication module 1730 may transmit a signal to an external electronic device or receive a signal from the external electronic device through an antenna suitable for a communication scheme. An antenna pattern of the wireless communication module 20 may be integrated into one component of the display module DM (e.g., the display panel DP) or the input sensor IS.

The audio output module 50 may be a device for outputting an audio signal to the outside of the electronic device ED, and may include, for example, a speaker used for general purposes such as multimedia playback or recording playback, and a receiver used exclusively for phone reception. According to an embodiment, the receiver may be implemented separately from or as a part of the speaker. The audio output pattern of the audio output module 50 may be integrated into the display module DM.

The camera module 1710 may capture a still image and a moving image. According to an embodiment, the camera module 1710 may include one or more lenses, image sensors, or image signal processors. The camera module 1710 may further include an infrared camera capable of measuring the presence or absence, the position, or line of sight of the user, etc.

The light module 1720 may provide light. The light module 1720 may include a light-emitting diode or a xenon lamp. The light module 1720 may operate in conjunction with or independently of the camera module 1710.

The communication module 1730 may support the establishment of a wired or wireless communication channel between the electronic device ED and the external electronic device 102, and the performance of communication through the established communication channel. The communication module 1730 may include any one or all of a wireless communication module (e.g., a cellular communication module, a short-range wireless communication module, a global navigation satellite system (GNSS) communication module) and a wired communication module (e.g., a local area network (LAN) communication module or a power line communication module). The communication module 1730 may communicate with the external electronic device 102 via a short-range communication network such as Bluetooth, WiFi direct, or infrared data association (IrDA), or a long-range communication network such as a cellular network, the Internet, or a computer network (e.g., a LAN or WAN). Various types of communication module 1730 described above may be implemented as one chip or as separate chips.

The input module 1300, the sensor module 1610, the camera module 1710, etc. may be used to control the operation of the display module DM in conjunction with the processor 1800.

The processor 1800 may output a command or data to the display module DM, the audio output module 50, the camera module 1710, or the light module 1720 based on input data received from the input module 1300. For example, the processor 1800 may generate the image data in response to the input data received through the mouse or the active pen and output the image data to the display module DM, or generate command data in response to the input data and output the image data to the camera module 1710 or the light module 1720. When no input data is received from the input module 1300 for a certain period of time, the processor 1800 may reduce power consumption in the electronic device ED by switching the operation mode of the electronic device ED to a low-power mode or a sleep mode.

The processor 1800 may output a command or data to the display module DM, the audio output module 50, the camera module 1710, or the light module 1720 based on sensing data received from the input module 1300. For example, the processor 1800 may compare authentication data applied by the fingerprint sensor 1610-1 with authentication data stored in the memory 60 and execute an application based on the comparison result. The processor 1800 may execute a command or output corresponding image data to the display module DM based on the sensing data sensed by the input sensor IS or the digitizer module DTM. When a temperature sensor is included in the sensor module 1610, the processor 1800 may receive temperature data on the temperature measured from the sensor module 1610 and perform brightness correction, etc., on the image data based on the temperature data.

The processor 1800 may receive measurement data on the presence or absence, position, and line or sight of the user, etc., from the camera module 1710. The processor 1800 may further perform brightness correction, etc., on the image data based on the measurement data. For example, the processor 1800 that determines the presence or absence of the user through the input from the camera module 1710 may output the image data with brightness corrected through the data conversion circuit 1820-2 or the gamma correction circuit 1820-3 to the display module DM.

Some of the components may be connected to one another via a communication scheme between peripheral devices (e.g., a bus, general purpose input and output (GPIO), a serial peripheral interface (SPI), a mobile industry processor interface (MIPI), or an ultra-path interconnect (UPI) link) to exchange signals (e.g., a command or data). The processor 1800 may communicate with the display module DM through a mutually agreed interface, and may use, for example, any one of the above-described communication schemes, but is not limited to the above-described communication schemes.

The electronic device ED according to various embodiments disclosed herein may be devices of various forms. The electronic device ED may include, for example, at least one of a portable communication device (e.g., a smartphone), a computer device, a portable multimedia device, a portable medical device, a camera, a wearable device, or a home appliance device. However, embodiments of the electronic device ED are not limited to the devices described above.

Each of the embodiments described above may be implemented independently, but the structure of each embodiment may be applied in combination with other embodiments.

Although the present disclosure has been described with reference to examples shown in the drawings, it will be understood by those of ordinary skill in the art that various modifications and equivalent other examples may be made from the shown example.

Specific implementations described in the embodiments are examples and do not limit the scope of the embodiments in any way.

In the specification (especially, claims) of the present disclosure, the use of the term "the" and similar indicators thereof may correspond to both the singular and the plural. Moreover, when a range is described in an example, the invention includes the application of individual values within the range (unless there is a statement to the contrary), and is the same as describing each individual value constituting the range in the detailed description. Finally, when there is no apparent description of the order of operations constituting the method according to the disclosure or a contrary description thereof, the operations may be performed in an appropriate order. However, the embodiments are not necessarily limited according to the describing order of the operations. In addition, it may be understood by those of ordinary skill in the art that various modifications, combinations, and changes may be made according to design conditions and factors within the scope of the appended claims or equivalents thereof.

According to an embodiment of the present disclosure, a display device and an electronic device are provided in which the combined thickness of the digitizer module and the circuit board module remains more unform after pressing. This design compensates for step differences, enhances surface quality, and mitigates issues related to corrosion and drooping.

However, the scope of the present disclosure is not limited by these effects.

What is claimed is:

1. A display device comprising:

a display panel comprising a first non-folding area, a second non-folding area, and a folding area arranged between the first non-folding area and the second non-folding area;

a lower member arranged under the display panel;

a digitizer module arranged under the lower member; and a circuit board module arranged in a region under the digitizer module, wherein the lower member comprises a panel support that overlaps at least the first non-folding area and the second non-folding area, and the digitizer module comprises:

a digitizer comprising a loop coil and overlapping the first non-folding area and the second non-folding area;

a metal layer arranged under the digitizer; and a cushioning member arranged under the metal layer, and the circuit board module comprises:

a circuit board electrically connected to the digitizer and arranged under the digitizer;

a circuit board lead arranged on the circuit board; and a protection member arranged on the circuit board lead, and the digitizer module and the circuit board module are bonded by an anisotropic conductive film, and the cushioning member comprises a first cushioning layer having a first opening, and a second cushioning layer arranged under the first cushioning layer and overlapping the first opening, the second cushioning layer having a second opening.

2. The display device of claim 1, wherein the circuit board lead extends beyond the protection member, and the circuit board extends further outward from the circuit board lead.

3. The display device of claim 1, wherein the protection member at least partially overlaps a region of the anisotropic conductive film.

4. The display device of claim 1, wherein an outer end of the protection member is located in the first opening.

5. The display device of claim 1, wherein the anisotropic conductive film is positioned in a region that overlaps at least the circuit board lead within the first opening.

6. The display device of claim 1, wherein the second opening includes a first area that overlaps the protection member and a second area adjacent to the first area, and a width of the first area is greater than a width of the second area.

7. The display device of claim 6, wherein the anisotropic conductive film covers at least a part of the second area.

8. The display device of claim 6, wherein an outer end of the circuit board is located on the second area or the second cushioning layer.

9. The display device of claim 6, wherein an outer end of the circuit board lead corresponds to an inner end of the second area.

10. An electronic device comprising:

an input module;

a memory storing at least one program;

a processor configured to operate by executing the at least one program;

a display device; and a power module configured to supply power to the display device, wherein the processor is further configured to control the input module to obtain data and control the display device to visually display the data, and the display device comprises:

a display module comprising a first non-folding area, a second non-folding area, and a folding area arranged between the first non-folding area and the second non-folding area;

a lower member arranged under the display module;

a digitizer module arranged under the lower member; and a circuit board module arranged in a region under the digitizer module, wherein the lower member comprises a panel support that overlaps at least the first non-folding area and the second non-folding area, and the digitizer module comprises:

a digitizer comprising a loop coil and overlapping the first non-folding area and the second non-folding area;

a metal layer arranged under the digitizer; and a cushioning member arranged under the metal layer, and the circuit board module comprises:

a circuit board electrically connected to the digitizer and arranged under the digitizer;

a circuit board lead arranged on the circuit board;

a protection member arranged on the circuit board lead; and an anisotropic conductive film bonding the digitizer module and the circuit board module, wherein the cushioning member comprises a first cushioning layer having a first opening, and a second cushioning layer arranged under the first cushioning layer and overlapping the first opening, the second cushioning layer having a second opening.

11. The electronic device of claim 10, further comprising an embedded module, wherein the embedded module comprises:

a sensor module configured to detect an input and generate data corresponding to the input;

an antenna module configured to exchange the data with an external electronic device; and an audio output module, wherein the processor is further configured to control the audio output module to output the data audibly.

12. The electronic device of claim 10, further comprising an external module, wherein the external module comprises:

a camera module configured to capture an image;

a light module configured to output light; and a communication module configured to exchange the data between the electronic device and an external electronic device.

13. The electronic device of claim 10, wherein the circuit board lead extends beyond the protection member, and the circuit board extends further outward from the circuit board lead.

14. The electronic device of claim 10, wherein the protection member at least partially overlaps a region of the anisotropic conductive film.

15. The electronic device of claim 10, wherein an outer end of the protection member is located in the first opening.

16. The electronic device of claim 10, wherein the anisotropic conductive film is positioned in a region that overlaps at least the circuit board lead in the first opening.

17. The electronic device of claim 10, wherein the second opening includes a first area that overlaps the protection member and a second area adjacent to the first area, and a width of the first area is greater than a width of the second area.

18. The electronic device of claim 17, wherein the anisotropic conductive film covers at least a part of the second area.

19. The electronic device of claim 17, wherein an outer end of the circuit board is located on the second area or the second cushioning layer and an outer end of the circuit board lead corresponds to an inner end of the second area.

20. A display device comprising:

a display panel comprising a first non-folding area, a second non-folding area, and a folding area arranged between the first non-folding area and the second non-folding area;

a digitizer arranged under the display panel;

a circuit board electrically connected to the digitizer and arranged under the digitizer;

a circuit board lead arranged on the circuit board;

a metal layer arranged under the digitizer;

a protection member arranged on the circuit board lead;

an anisotropic conductive film bonding the digitizer to the circuit board; and a cushioning member arranged under the metal layer, the cushioning member comprising:

a first cushioning layer having a first opening; and a second cushioning layer arranged under the first cushioning layer, overlapping the first opening, and having a second opening offset from the first opening.

* * * * *